(12) United States Patent
Yin et al.

(10) Patent No.: US 11,417,832 B2
(45) Date of Patent: Aug. 16, 2022

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Feng Yin, Hsinchu County (TW); Tai-Yen Peng, Hsinchu (TW); An-Shen Chang, Hsinchu County (TW); Han-Ting Tsai, Kaoshiung (TW); Qiang Fu, Hsinchu (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/008,000

(22) Filed: Aug. 31, 2020

(65) Prior Publication Data

US 2022/0069201 A1 Mar. 3, 2022

(51) Int. Cl.
*H01L 43/02* (2006.01)
*H01L 21/768* (2006.01)
*H01L 23/522* (2006.01)
*H01L 43/12* (2006.01)

(52) U.S. Cl.
CPC .......... *H01L 43/02* (2013.01); *H01L 21/7684* (2013.01); *H01L 23/5226* (2013.01); *H01L 43/12* (2013.01)

(58) Field of Classification Search
CPC ..... H01L 43/02; H01L 43/12; H01L 21/7684; H01L 23/5226
USPC ....................................................... 257/421
IPC ............... H01L 43/02,43/12, 21/7684, 23/5226
See application file for complete search history.

(56) References Cited

U.S. PATENT DOCUMENTS

| | | |
|---|---|---|
| 10,276,794 B1 | 4/2019 | Peng et al. |
| 10,644,231 B2 | 5/2020 | Peng et al. |
| 2013/0244344 A1* | 9/2013 | Malmhall ............. B82Y 10/00 438/3 |
| 2020/0066580 A1 | 2/2020 | Peng et al. |
| 2021/0257404 A1* | 8/2021 | Lee ................... H01L 21/76816 |

\* cited by examiner

*Primary Examiner* — Tu-Tu V Ho
(74) *Attorney, Agent, or Firm* — WPAT, P.C. Intellectual Property Attorneys; Anthony King

(57) ABSTRACT

The present disclosure provides a semiconductor structure, including a substrate, including a first region and a second region adjacent to the first region, a magnetic tunnel junction (MTJ) over the first region, a spacer on a sidewall of the MTJ, a hard mask over the MTJ, a first dielectric layer laterally surrounding the spacer and the hard mask, a top electrode over the hard mask, and an etch stop stack laterally surrounding the top electrode.

20 Claims, 23 Drawing Sheets

SEMICONDUCTOR DEVICE AND MANUFACTURING METHOD THEREOF

CROSS REFERENCE TO RELATED APPLICATIONS

This application is related to Applicant's previously filed U.S. application Ser. No. 16/887,244, filed on May 29, 2020, which is herein incorporated by reference.

BACKGROUND

Semiconductor memories are used in integrated circuits for electronic applications, including radios, televisions, cell phones, and personal computing devices, as examples. One type of semiconductor device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
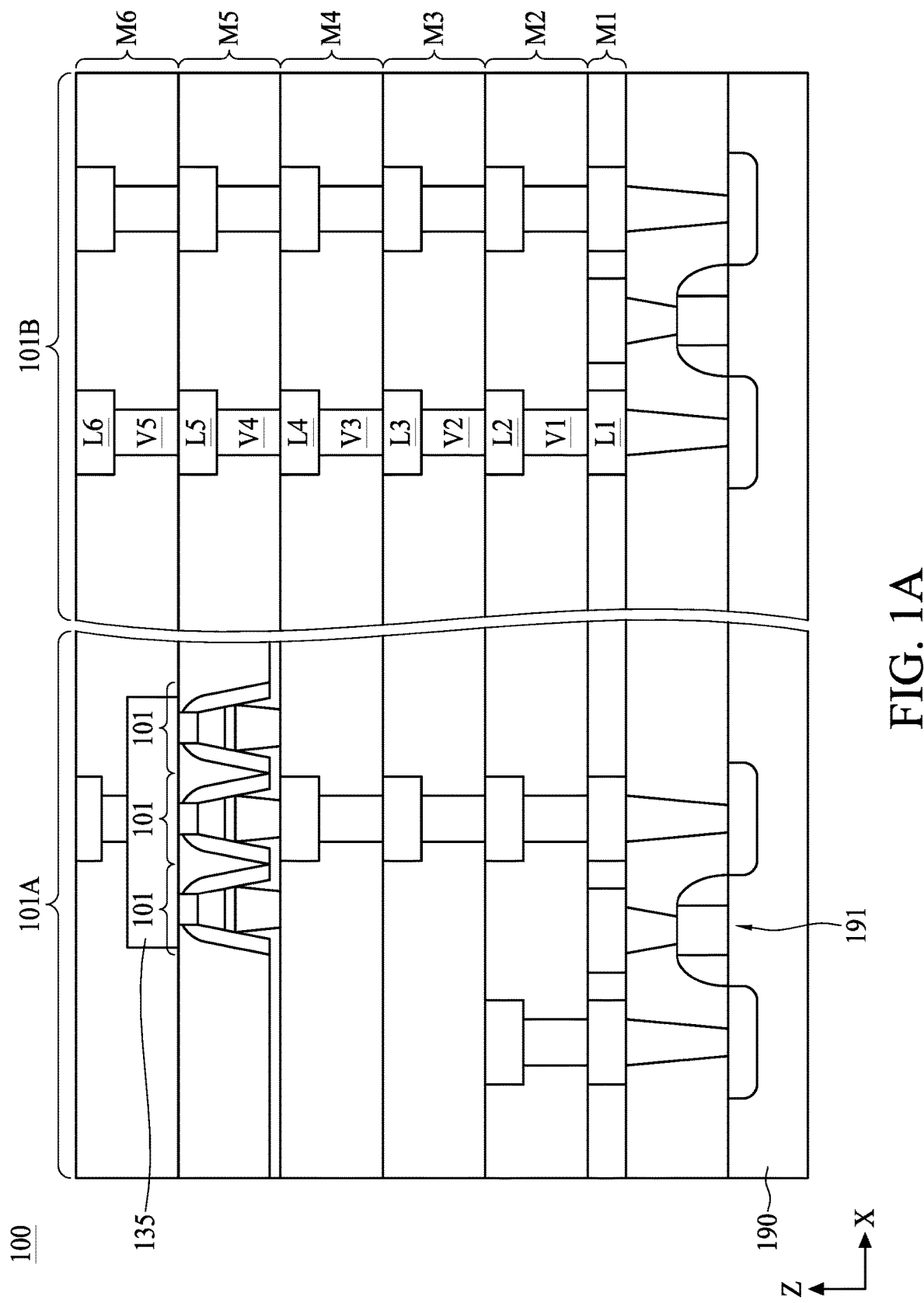
FIG. 1A is a cross sectional view of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The semiconductor integrated circuit (IC) industry has experienced exponential growth. Technological advances in IC materials and design have produced generations of ICs where each generation has smaller and more complex circuits than the previous generation. With the trend of scaling down the geometry size and the pitches between two memory cells, it is difficult to control the position of the interconnect structure, such as vias, during the fabrication operations. In addition, when a dimension of recess for forming conductive via is greater than a top portion of an underlying memory cell, the issue of via punch through, damaging to memory cells, and/or leakage issues may occur.

Furthermore, in some of the cases, a memory cell may be affected by elevated temperature during a fabrication process with regard to thermal budget issues. Therefore, it is important to fabricate semiconductor devices by a method that may be compatible to fabrication methods for forming interconnect structures (such as damascene process, dual damascene process, or the like) while considering the factor of thermal budget.

The present disclosure provides a semiconductor device and a method for fabricating a semiconductor device to alleviate the issue(s) related to via punch through, damaging to memory cells, leakage issues may occur, and/or thermal budget, in order to improve the fabrication quality.

Figure 1B:
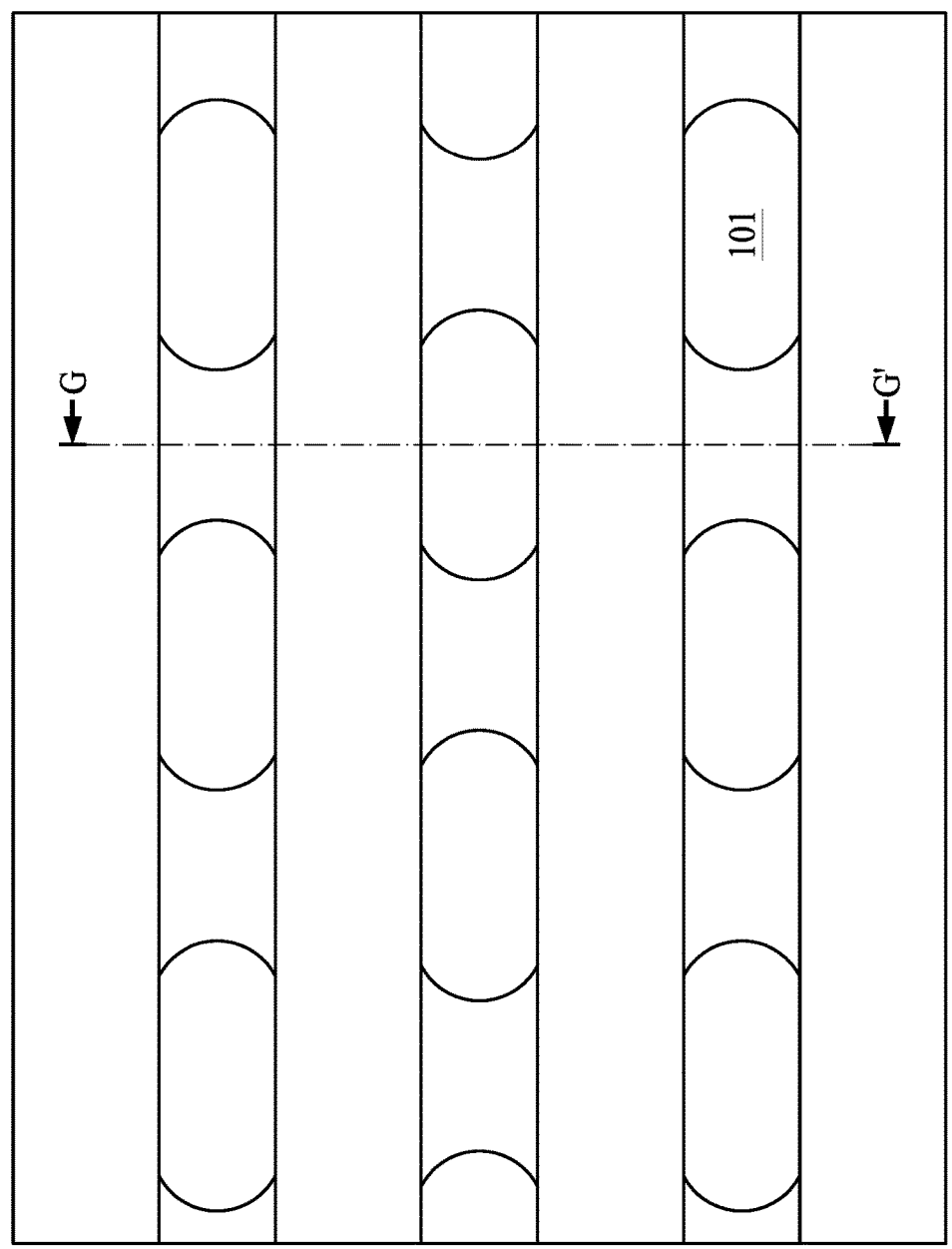
FIG. 1B is a top view of a semiconductor device, according to some embodiments of the present disclosure.

Referring to FIG. 1A and FIG. 1B, FIG. 1A is a cross sectional view of a semiconductor device, and FIG. 1B is a top view of a semiconductor device, according to some embodiments of present disclosure. It should be noted that FIG. 1A and FIG. 1B are simplified view, and some detailed features are omitted for clarity of illustration. Those details will be discussed in FIG. 2A to FIG. 13D. The semiconductor device 100 includes a memory region 101A and a logic region 101B over a substrate 190. An area of the logic region 101B may be greater than an area of the memory region 101A. Memory cells 101 are disposed in the memory region 101A. In some embodiments, the memory cells 101 are magnetic random access memory (MRAM) cells which includes magnetic tunnel junction (MTJ). Devices 191 are disposed at the active surface of the substrate 190. The devices 191 may be active devices or passive devices. For example, the device may be electrical components, such as transistors, diodes, capacitors, resistors, access transistors, or the like. The devices 191 can be electrically connected to the memory cells 101.

The substrate 190 may be silicon (either doped or undoped), or a semiconductor-on-insulator (SOI) substrate. The substrate 190 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combination thereof. Other materials substrates, such as multilayered or gradient substrates, may also be used.

Multiple metallization layers M1-M6 are formed over the substrate 190, wherein M1 is referred to the metallization layer being the most proximal to the substrate 190. Although six metallization layers are illustrated, it should be understood that more or less metallization layers may be included. Each of the metallization layers M1-M6 includes metallization patterns in dielectric layers. The metallization patterns are electrically coupled to the devices 191 of the substrate 190, and include, respectively, metal lines L1-L6 and metal vias V1-V6 formed in one or more inter-metal dielectric (IMD) layers. The metal lines L1-L6 and metal vias V1-V6 may be formed by a damascene process, such as a single damascene process, a dual damascene process, or the like.

The memory cells 101 are formed in one of the metallization layers M1-M6. In some embodiments, a row of memory cells 101 is formed in fifth metallization layer M5 or above. In some comparative embodiments, in the cases of the memory cells 101 are formed in lower metallization layers, such as metallization layers M1-M4, the memory cells 101 may be heated under elevated temperature for longer period of time since more fabrication procedures may be performed. Accordingly, the thermal budget issue may be alleviated when the memory cells 101 are formed in fifth metallization layer M5 or above. It should be noted that, although three memory cells 101 are illustrated in FIG. 1A, it should be understood that more or less memory cells may be included. As shown in FIG. 1B, each position of the memory cells 101 in two adjacent rows may be positioned in a staggered way, where a position of a memory cell 101 in a row corresponds to a space between two memory cells 101 in the next row along Y-direction.

In some embodiments, a plurality of memory cells 101 are connected by a top electrode 135 over the memory cells 101. In some embodiments, the top electrode 135 is formed in a metallization layer directly above the metallization layer formed with the memory cells 101. For example, in the case of the memory cells 101 are formed in fifth metallization layer M5, the top electrode 135 for connecting those memory cells 101 is formed in the sixth metallization layer M6. In some embodiments, some passive devices (not shown in FIG. 1A), such as a resistor structure, can be formed in the logic region 101B of the layer same as the top electrode 135, for example, in the sixth metallization layer M6.

The details of the configuration with regard to the memory cells 101 and the top electrode 135 will be subsequently discussed. Hereinafter some embodiments of semiconductor device 100A are discussed in FIG. 2A to FIG. 2B and FIG. 5 through FIG. 12D, and some alternative embodiments of semiconductor device 100B are discussed in FIG. 3A to FIG. 3B, FIG. 5 to FIG. 11, and FIG. 13A through FIG. 13D.

Figure 2A:
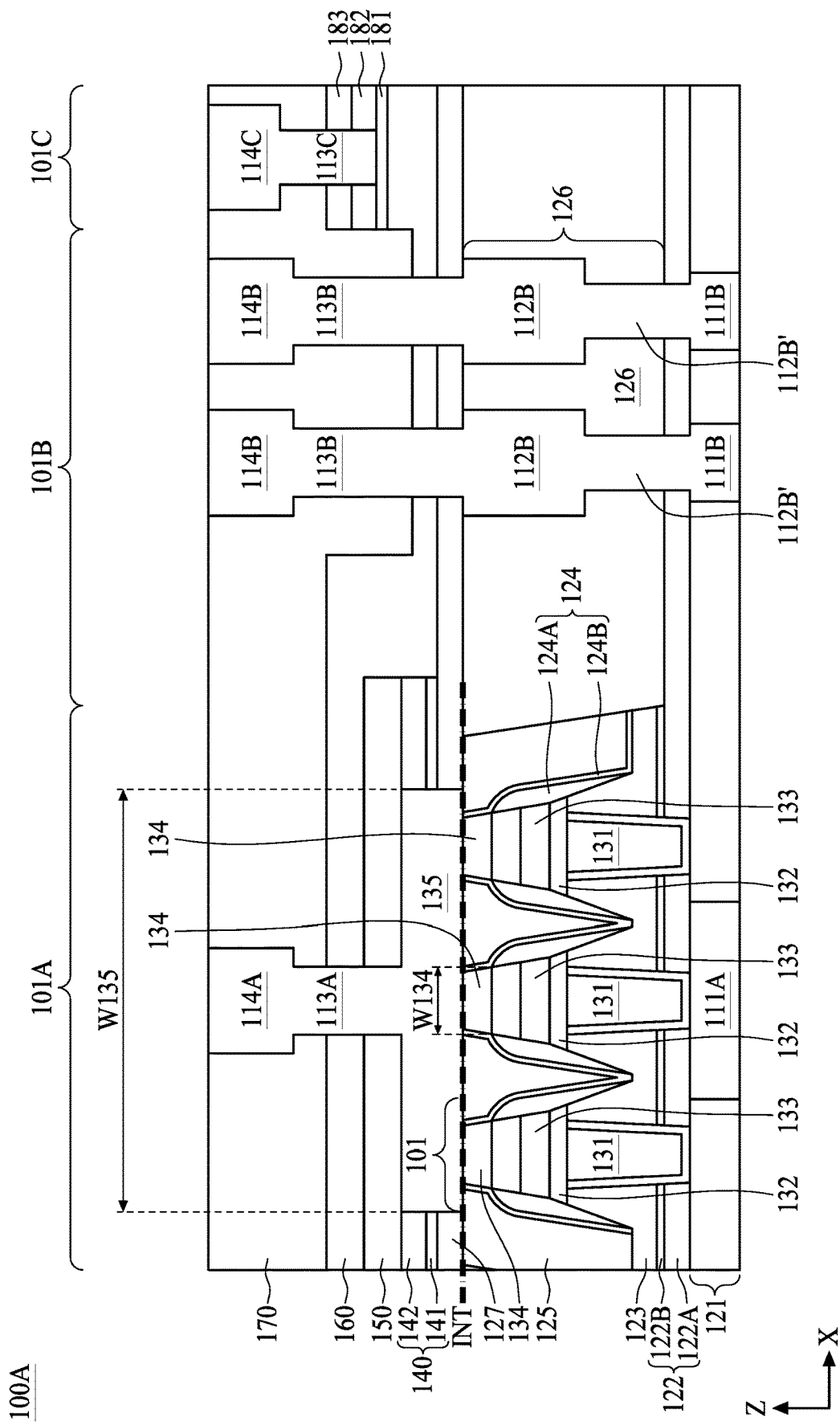
FIG. 2A is a cross sectional view dissecting along an X direction of a semiconductor device, according to some embodiments of the present disclosure.
Figure 2B:
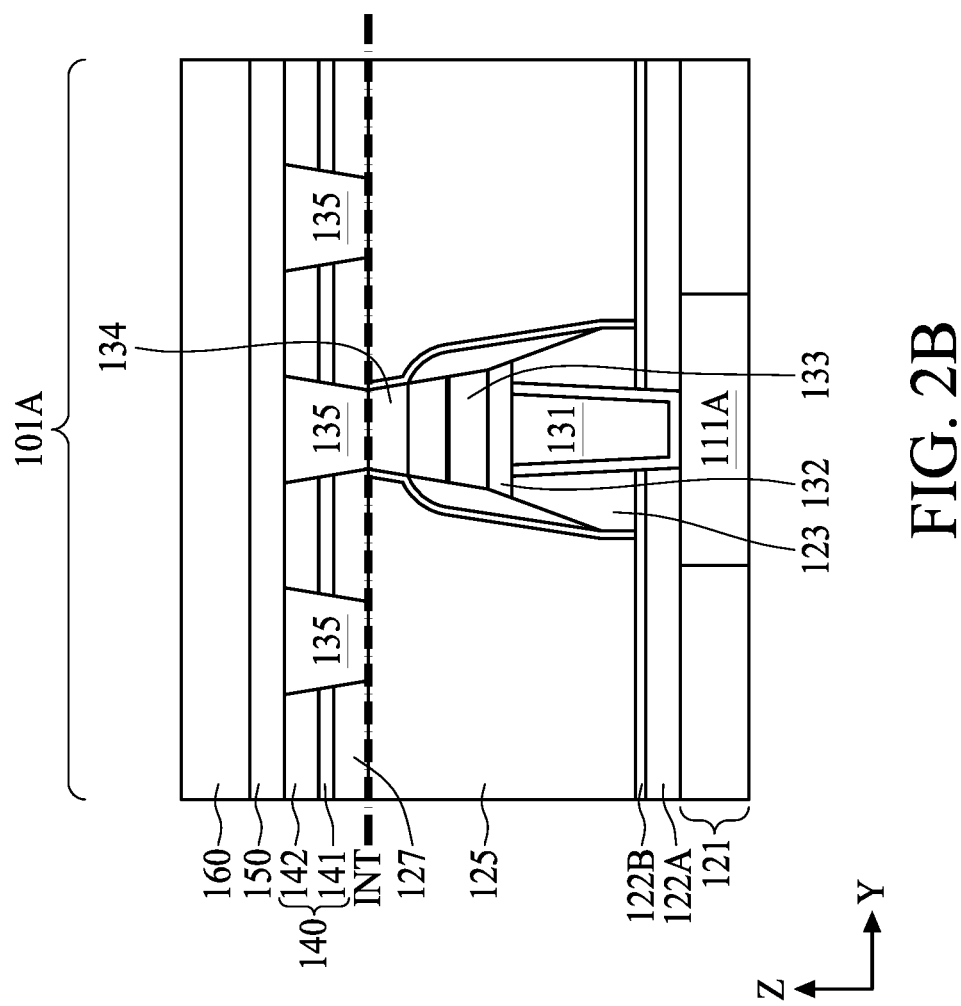
FIG. 2B is a cross sectional view dissecting along a Y direction of a semiconductor device, according to some embodiments of present disclosure.

Referring to FIG. 2A and FIG. 2B, FIG. 2A is a cross sectional view dissecting along an X direction of a semiconductor device, FIG. 2B is a cross sectional view dissecting along a Y direction of a semiconductor device (corresponding to the cross section along line G-G' in FIG. 1B), according to some embodiments of the present disclosure. A first $(N-1)^{th}$ metal line 111A is formed over the memory region 101A in the $(N-1)^{th}$ metallization layer 121, and a second $(N-1)^{th}$ metal line 111B is formed over the logic region 101B in the $(N-1)^{th}$ metallization layer 121, wherein N is an integer greater than 1. In some embodiments, N is 5 or greater than 5. In some embodiments, the $(N-1)^{th}$ metallization layer 121 includes inter-metal dielectric (IMD) material. An etch stop layer 122 is above the $(N-1)^{th}$ metallization layer 121, and extends from the memory region 101A to the logic region 101B. In some embodiments, the etch stop layer 122 includes multi-layer structure, for example, a first etch stop film 122A and a second etch stop film 122B over the first etch stop film 122A. In some embodiments, at least a portion of the second etch stop film 122B is removed and a portion of the first etch stop film 122A is free from being covered by the second etch stop film 122B. In some of the embodiments, the first etch stop film 122A is a silicon-based layer, such as silicon carbide, silicon oxide, silicon nitride, silicon oxynitride, or the like. In some of the embodiments, the second etch stop film 122B includes oxide, such as aluminum oxide.

However, it should be noted that the number of films in the etch stop layer 122 is not limited to two. For example, the etch stop layer 122 may include more than three layers. In some alternative embodiments, the etch stop layer 122 may be a single layer. For example, the etch stop layer 122 includes silicon-based material, such as silicon carbide, silicon oxide, silicon nitride, silicon oxynitride, or the like.

A first dielectric layer 123 is above the etch stop layer 122 in the memory region 101A. A plurality of bottom electrode via (BEVA) 131 is disposed in the first dielectric layer 123 in a row and penetrating the etch stop layer 122, and the first dielectric layer 123 includes a plurality of concaved area between the adjacent BEVA 131. A bottom electrode 132 is formed above each of the BEVA 131, an MTJ 133 is over each of the bottom electrode 132, and a hard mask 134 is formed over each of the MTJ 133. The hard mask 134 may be made from a conductive material, such as titanium nitride (TiN). A spacer 124 covers a sidewall of the MTJ 133 and the bottom electrode 132. In some embodiments, the spacer 124 may further be in direct contact with a sidewall of the concaved area of the first dielectric layer 123 and/or a sidewall of the hard mask 134. In some embodiments, the spacer 124 includes multi-layer structure, for example, a first spacer 124A and a second spacer 124B over the first spacer 124A, wherein both of the first spacer 124A and the second spacer 124B are made with passivation material. In some embodiments, the second spacer 124B is in direct contact with the hard mask 134 and a top surface of the first dielectric layer 123. Herein one BEVA 131, one bottom electrode 132, one MTJ 133, one hard mask 134, and the spacer 124 surrounding the MTJ 133 constitute one memory cell 101. The memory cell 101 is leveled with the $N^{th}$ via 112B. A second dielectric layer 125 in the memory region 101A surrounds the memory cells 101 and is filled in the spaces between adjacent spacers 124. A top surface of the second dielectric layer 125 may be coplanar with a top surface of the hard mask 134.

The memory region 101A correspondingly leveled with an $N^{th}$ metallization layer 126 includes the second dielectric layer 125. The $N^{th}$ metallization layer 126 is over the logic region 101B. The $N^{th}$ metallization layer 126 may include an $(N-1)^{th}$ via 112B' and an $N^{th}$ metal line 112B over the $(N-1)^{th}$ via 112B'. A protection layer 127 is formed over the second dielectric layer 125, the hard mask 134, and the $N^{th}$ metallization layer 126. In some embodiments, the protection layer 127 may be a carbide layer, such as silicon carbide. In some embodiments, the protection layer 127 includes silicon-based material, such as silicon carbide, silicon oxide, silicon nitride, silicon oxynitride, or the like. In some embodiments, an etch stop stack 140 is in the memory region 101A and over the protection layer 127. In some embodiments, the etch stop stack 140 includes multi-layer structure, for example, a first layer 141 and a second layer 142 over the first layer 141. In some embodiments, the first layer 141 includes aluminum-derivative layer (such as aluminum oxide), and the second layer 142 may include oxide, such as tetraethyl orthosilicate (TEOS). In some embodiments, the logic region 101B is free from a coverage of the first layer 141 and the second layer 142 (or the etch stop stack 140).

A top electrode 135 is formed over the memory region 101A and laterally surrounded by the etch stop stack 140. The top electrode 135 is electrically connected to a plurality of memory cells 101 and the bottom surface thereof is in direct contact with each hard mask 134 of the memory cells 101. In some embodiments shown in FIG. 2A and FIG. 2B, a bottom surface of the top electrode 135 is above an interface INT between the $N^{th}$ metallization layer 126 and the protection layer 127 (which, in one example discussed in FIG. 1A, the interface INT is between $5^{th}$ and $6^{th}$ metallization layer.) In some embodiments, the bottom surface of the top electrode 135 may be substantially flat, alternatively stated, a top surface of the second dielectric layer 125 is coplanar with a top surface of the hard mask 127. A width W135 of the top electrode 135 is greater than a width W134 of the hard mask 134 in X-direction. In some embodiments, the width W135 of the top electrode 135 is greater than three times of the width W134. In some embodiments, a plurality of the hard masks 134 in direct contact with the top electrode 135 are entirely under the coverage of a projection area of the top electrode 135. In some embodiments, a sidewall of the first layer 141 of the etch stop stack 140 is in direct contact with a sidewall of the top electrode 135. The top electrode 135 extends from a position directly above a MTJ 133 of one memory cell 101 to a position above a MTJ 133 of another memory cell 101 in a same row.

A barrier layer 150 is disposed over the etch stop stack 140 and the top electrode 135 in the memory region 101A. In some embodiments, the barrier layer 150 may be a carbide layer, such as silicon carbide. In some embodiments, a material of the barrier layer 150 can also be, for example, selected from silicon oxide, silicon nitride, silicon oxynitride, or the like. In some embodiments, a material of the barrier layer 150 can be identical with the protection layer 127. A capping layer 160 covers the barrier layer 150 and further extends over the protection layer 127 in the logic region 101B. In some embodiments, the capping layer 160 may include oxide, such as tetraethyl orthosilicate (TEOS). A top surface of the capping layer 160 in the memory region 101A may be at a level higher than a top surface of the capping layer 160 in the logic region 101B. A first $N^{th}$ via 113A disposed in memory region 101A is connected to the top electrode 135 and penetrates the barrier layer 150 and the capping layer 160. A first $(N+1)^{th}$ metal line 114A is above and electrically connected to the first $N^{th}$ via 113A. A second $N^{th}$ via 113B disposed in logic region 101B is connected to the $N^{th}$ metal line 112B and surrounded by the protection layer 127 and the capping layer 160. A second $(N+1)^{th}$ metal line 114B is above and electrically connected to the second $N^{th}$ via 113B. An inter metal dielectric (IMD) layer 170 is above the capping layer 160 and laterally surrounding the first $N^{th}$ via 113A, the first $(N+1)^{th}$ metal line 114A, the second $N^{th}$ via 113B, and the second $(N+1)^{th}$ metal line 114B. The top electrode 135 is substantially leveled with the second $N^{th}$ via 113B.

In some of the embodiments, the semiconductor device 100A may further include a passive device region 101C (which can be referred to as Hi-R region), which include a thin tantalum nitride film 181 over the protection layer 127 and the capping layer 160, a barrier layer 182 (similar to the aforementioned barrier layer 150) over the thin tantalum nitride film 181, and an oxide layer 183 (such as TEOS layer) over the barrier layer 182. Herein the tantalum nitride is referred to as $TaN_x$, such as $TaN_4$. A third $N^{th}$ via 113C may penetrate the barrier layer 182 and oxide layer 183, and a third $(N+1)^{th}$ metal line 114C may be disposed over the third $N^{th}$ via 113C. The third $N^{th}$ via 113C may land on the thin tantalum nitride film 181. The third $N^{th}$ via 113C and the third $(N+1)^{th}$ metal line 114C are in the same metallization layer as the first $N^{th}$ via 113A, the first $(N+1)^{th}$ metal line 114A, the second $N^{th}$ via 113B, and the second $(N+1)^{th}$ metal line 114B. In some embodiments, a top surface of the capping layer 160 in the passive device region 101C is above a top surface of the capping layer 160 in the logic region 101B.

Figure 3A:
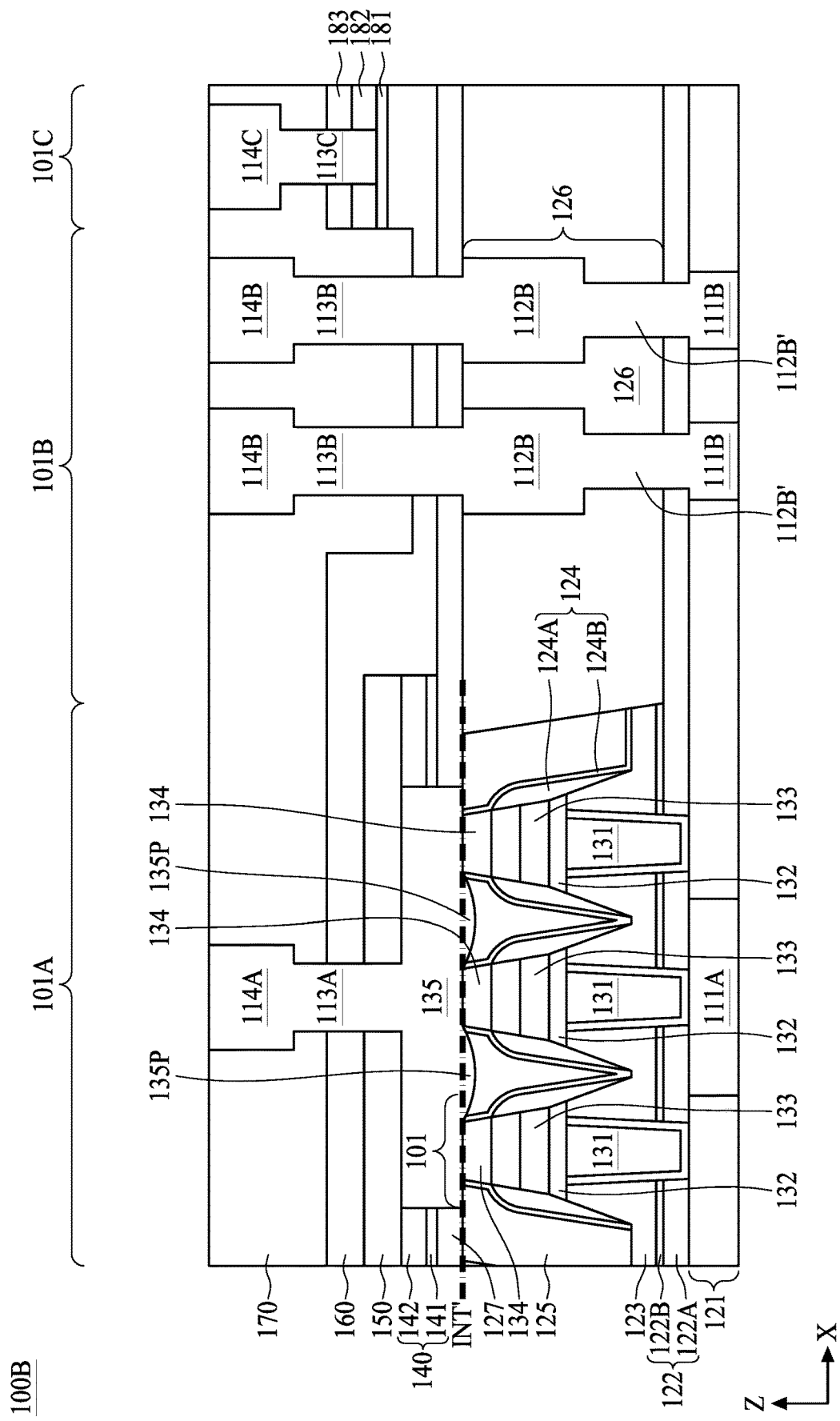
FIG. 3A is a cross sectional view dissecting along an X direction of a semiconductor device, according to some embodiments of the present disclosure.
Figure 3B:
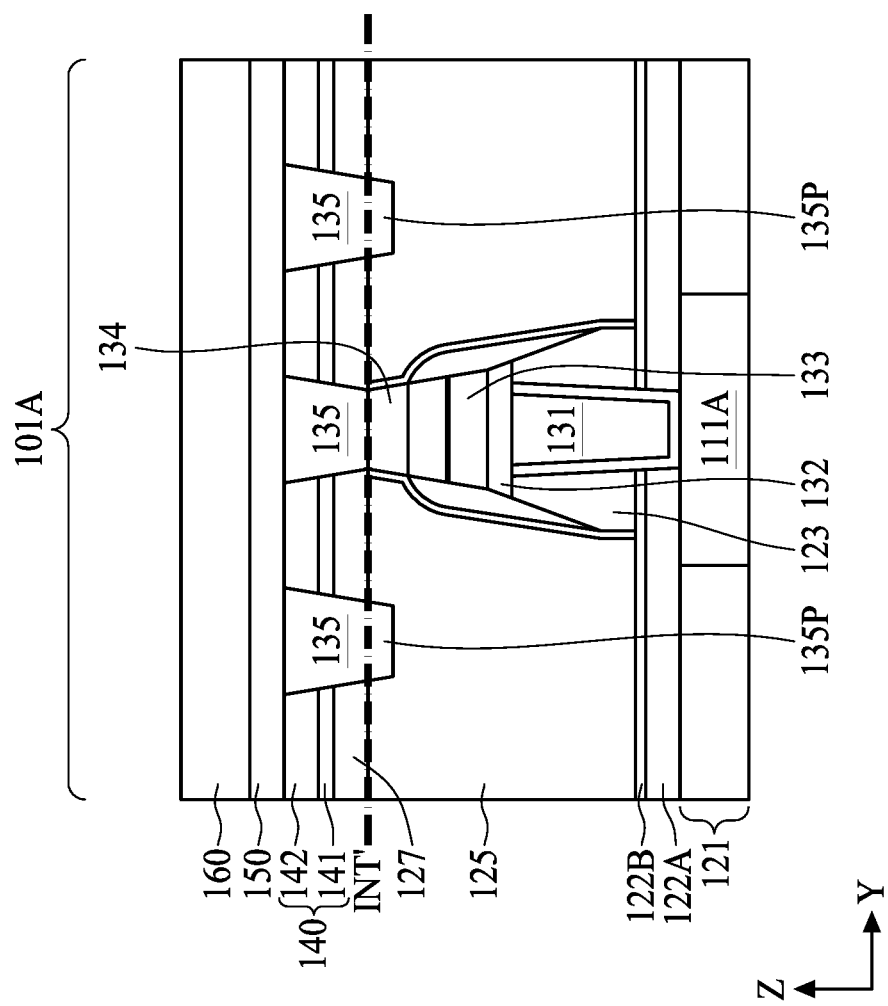
FIG. 3B is a cross sectional view dissecting along a Y direction of a semiconductor device, according to some embodiments of the present disclosure.

Referring to FIG. 3A and FIG. 3B, FIG. 3A is a cross sectional view dissecting along an X direction of a semiconductor device, FIG. 3B is a cross sectional view dissecting along a Y direction of a semiconductor device (corresponding to the cross section along line G-G' in FIG. 1B), according to some embodiments of present disclosure. The semiconductor device 100B of FIG. 3A to FIG. 3B is similar to the semiconductor device 100A are discussed in FIG. 2A to FIG. 2B. The difference resides in that herein the top electrode 135 includes a protruding portion 135P at the bottom, between two adjacent memory cells 101 and protruding toward the $(N-1)^{th}$ metallization layer 121. The second dielectric layer 125 includes a concaved area between two memory cells 101. Alternatively stated, a portion of the top electrode 135 is below an interface INT' between the $N^{th}$ metallization layer 126 and the protection layer 127 (which, in one example discussed in FIG. 1A, the interface INT' is between $5^{th}$ and $6^{th}$ metallization layer.)

In some embodiments, as shown in FIG. 3B (corresponding to the cross section along line G-G' in FIG. 1B), a position of a memory cell 101 of a row corresponds to a position of the protruding portion 135P of another memory cell 101 at an adjacent row (i.e. may present on a same cross section).

Figure 4A:
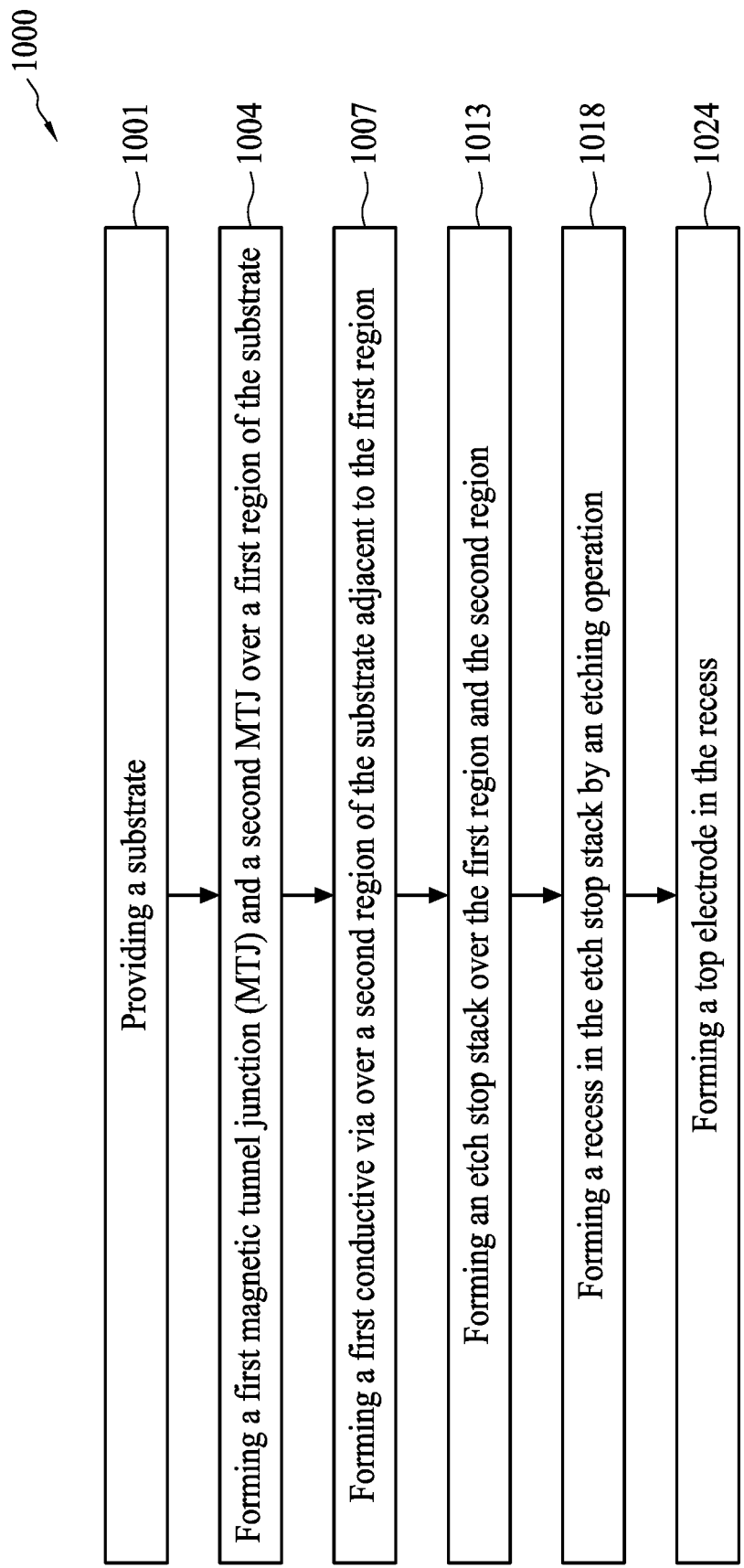
FIG. 4A shows a flow chart describing a method for fabricating a semiconductor device, in accordance with some embodiments of the present disclosure.

Referring to FIG. 4A, FIG. 4A shows a flow chart describing a method for fabricating a semiconductor device, in accordance with some embodiments of the present disclosure. The method 1000 for fabricating a semiconductor device includes providing a substrate (operation 1001, which can be referred to FIG. 5), forming a first magnetic tunnel junction (MTJ) and a second MTJ over a first region of the substrate (operation 1004, which can be referred to FIG. 7), forming a first conductive via over a second region of the substrate adjacent to the first region (operation 1007, which can be referred to FIG. 11), forming an etch stop stack over the first region and the second region (operation 1013, which can be referred to FIG. 12A or FIG. 13A), forming a recess in the etch stop stack by an etching operation (operation 1018, which can be referred to FIG. 12A or FIG. 13A), and forming a top electrode in the recess (operation 1024, which can be referred to FIG. 12B or FIG. 13B).

Figure 4B:
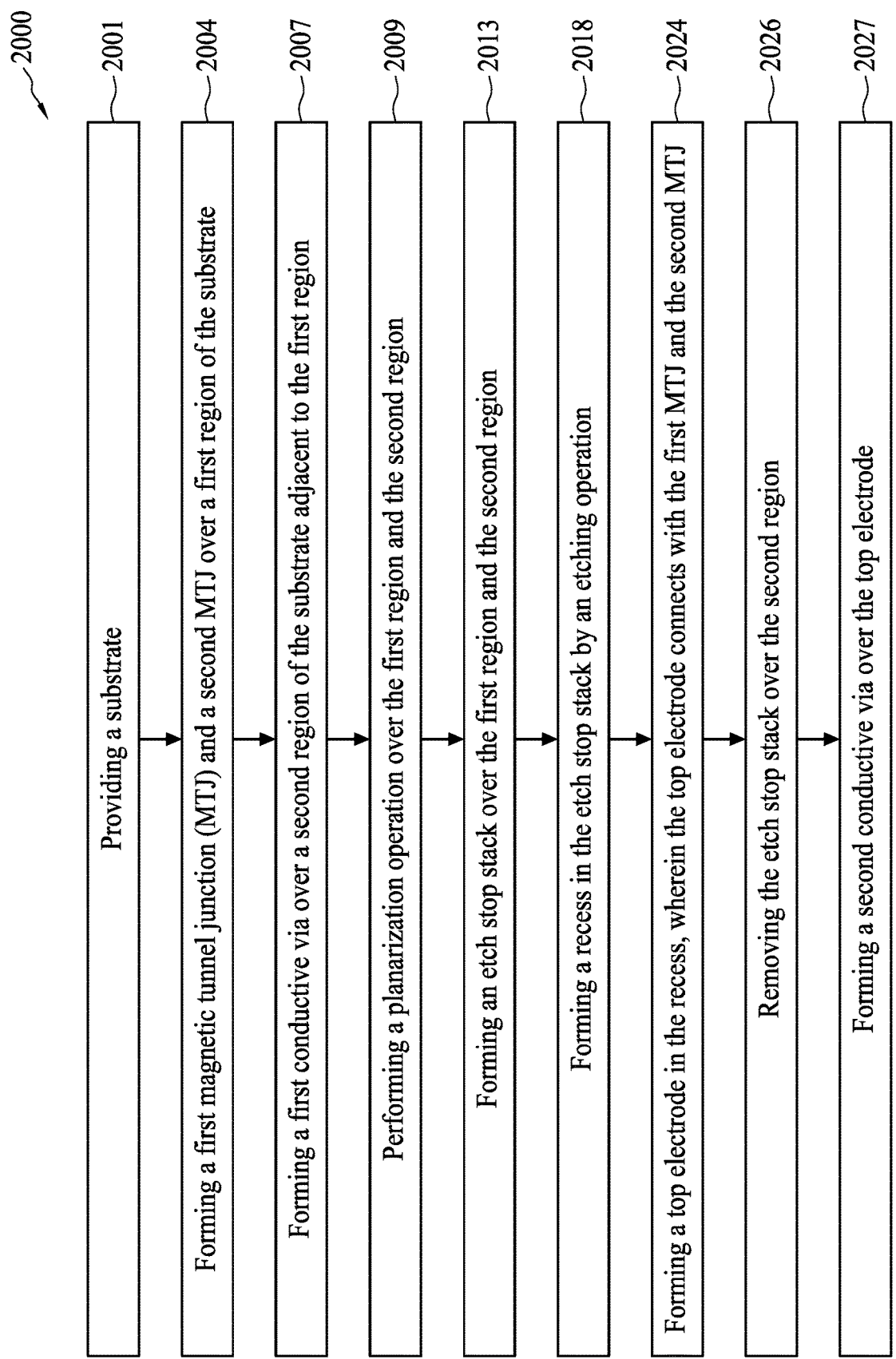
FIG. 4B shows a flow chart describing a method for fabricating a semiconductor device, in accordance with some embodiments of the present disclosure.

Referring to FIG. 4B, FIG. 4B shows a flow chart describing a method for fabricating a semiconductor device, in accordance with some embodiments of the present disclosure. The method 2000 for fabricating a semiconductor device includes providing a substrate (operation 2001, which can be referred to FIG. 5), forming a first magnetic tunnel junction (MTJ) and a second MTJ over a first region of the substrate (operation 2004, which can be referred to FIG. 7), forming a first conductive via over a second region of the substrate adjacent to the first region (operation 2007, which can be referred to FIG. 11), performing a planarization operation over the first region and the second region (operation 2009, which can be referred to FIG. 11), forming an etch stop stack over the first region and the second region (operation 2013, which can be referred to FIG. 12A or FIG. 13A), forming a recess in the etch stop stack by an etching operation (operation 2018, which can be referred to FIG. 12A or FIG. 13A), forming a top electrode in the recess, wherein the top electrode connects with the first MTJ and the second MTJ (operation 2024, which can be referred to FIG. 12B or FIG. 13B), removing the etch stop stack over the second region (operation 2026, which can be referred to FIG. 12D or FIG. 13D), and forming a second conductive via over the top electrode (operation 2027, which can be referred to FIG. 12D or FIG. 13D).

Figure 5:
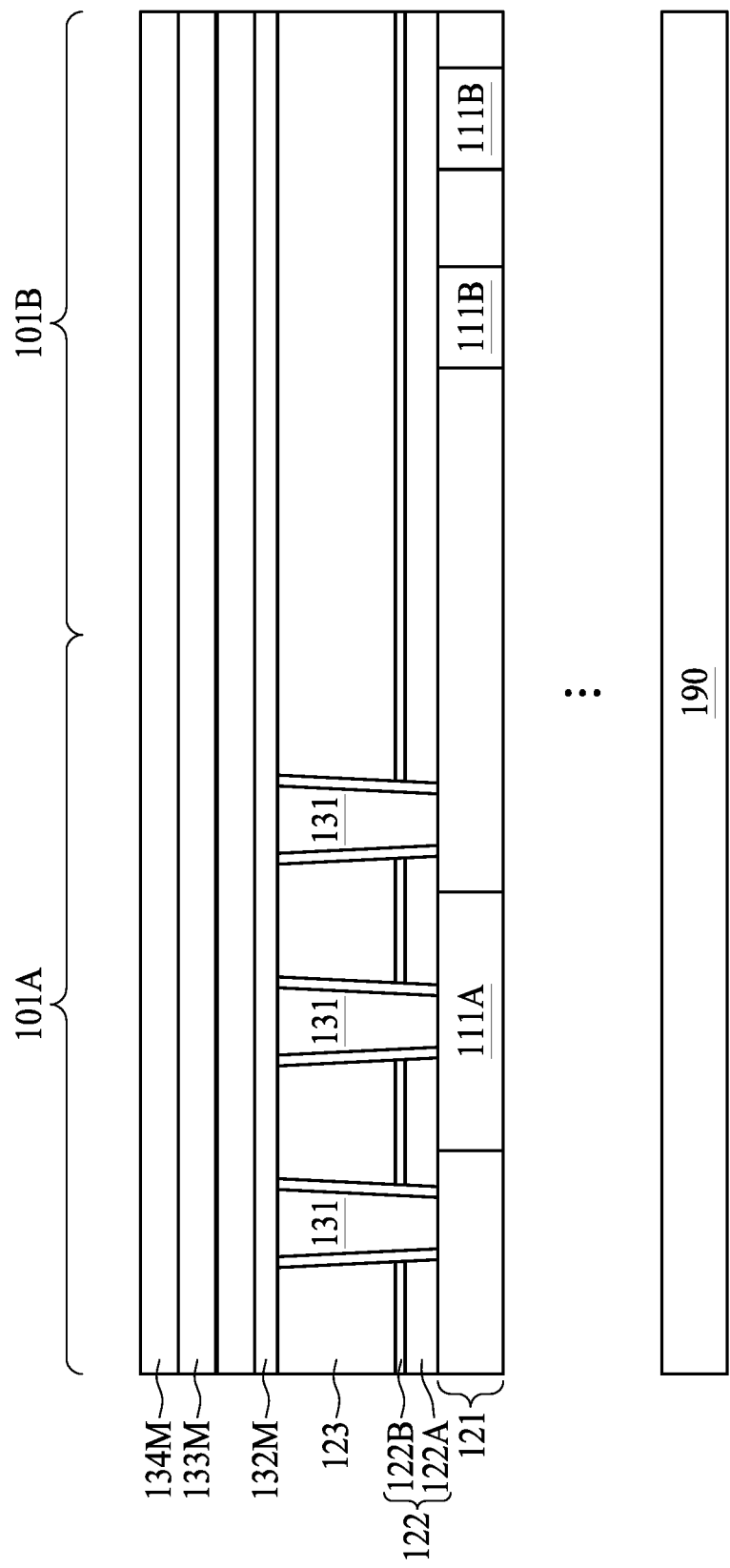
FIG. 5 to FIG. 11 are cross sectional views of a semiconductor device during intermediate stages of manufacturing operations, according to some embodiments of the present disclosure.

Referring to FIG. 5, FIG. 5 is a cross sectional view of a semiconductor device during intermediate stages of manufacturing operations, according to some embodiments of present disclosure. A substrate 190 having a memory region 101A and a logic region 101B is provided. The substrate 190 may be silicon (either doped or undoped), or a semiconductor-on-insulator (SOI) substrate. The substrate 190 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combination thereof. Other materials substrates, such as multilayered or gradient substrates, may also be used.

An $(N-1)^{th}$ metallization layer 121 is formed over the substrate 190. A first $(N-1)^{th}$ metal line 111A is formed in the memory region 101A in the $(N-1)^{th}$ metallization layer 121, and a second $(N-1)^{th}$ metal line 111B is formed in the logic region 101B in the $(N-1)^{th}$ metallization layer 121, wherein N is an integer greater than 1. An etch stop layer 122 is formed over the $(N-1)^{th}$ metallization layer 121, and extends from the memory region 101A to the logic region 101B. In some embodiments, the etch stop layer 122 includes multilayer structure, for example, a first etch stop film 122A and a second etch stop film 122B over the first etch stop film 122A. In some of the embodiments, the first etch stop film 122A is a silicon-based layer, such as silicon carbide, silicon oxide, silicon nitride, silicon oxynitride, or the like. In some of the embodiments, the second etch stop film 122B includes oxide, such as aluminum oxide. A first dielectric layer 123 is formed over the etch stop layer 122 in the memory region 101A, and a plurality of bottom electrode via (BEVA) 131 is formed in the first dielectric layer 123 in a row. Herein the etch stop layer 122 is utilized to control the etching speed and profile during the fabrication operation of the BEVA 131.

A bottom electrode material layer 132M is formed over the first dielectric layer 123 and the BEVA 131 in the memory region 101A and the logic region 101B, a MTJ material layer 133M is formed over the first dielectric layer 123, and a hard mask material layer 134M is formed over the MTJ material layer 133M. The hard mask layer 134M may include a conductive material, such as titanium nitride (TiN).

Figure 6:
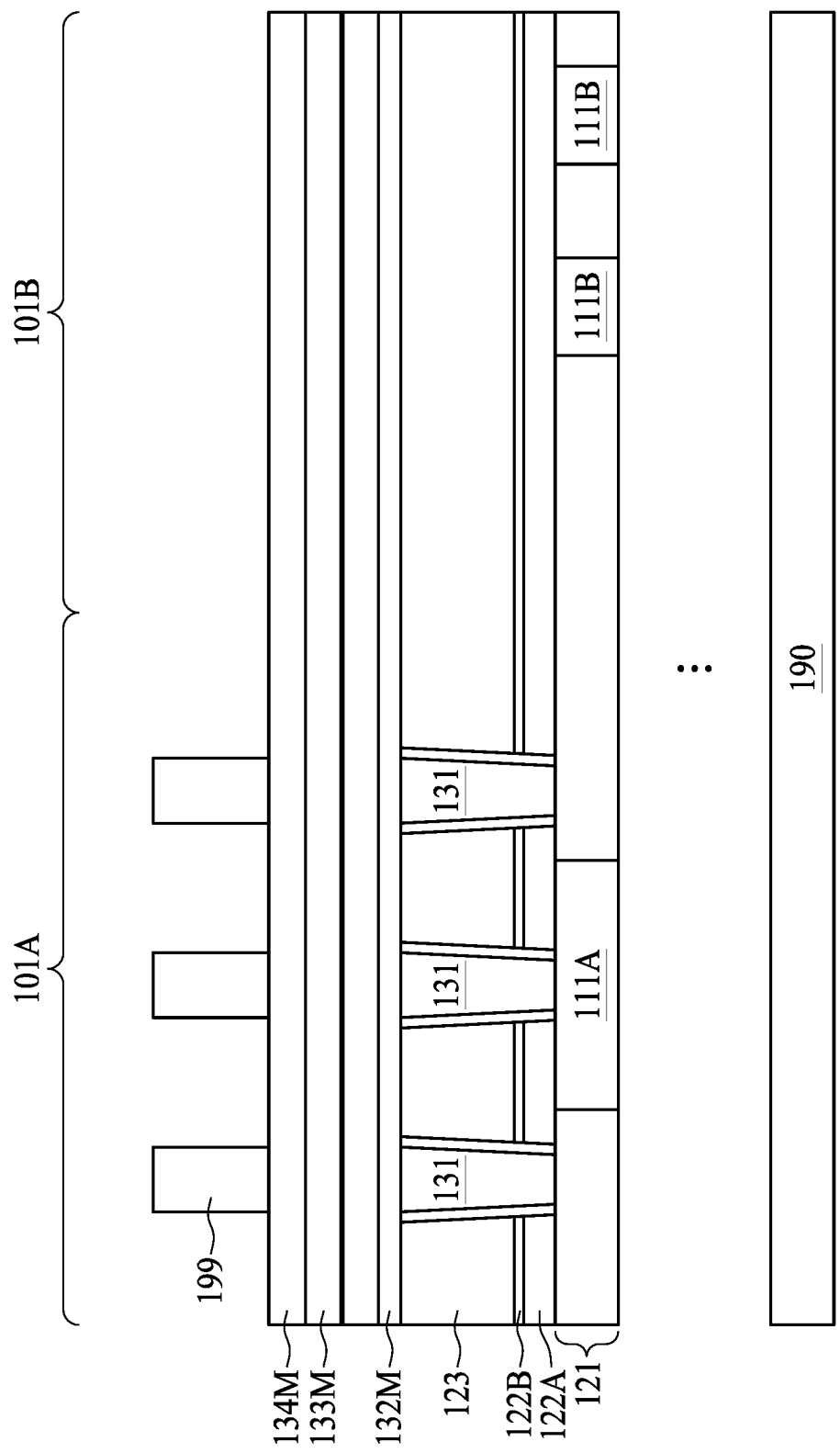
Figure 7:
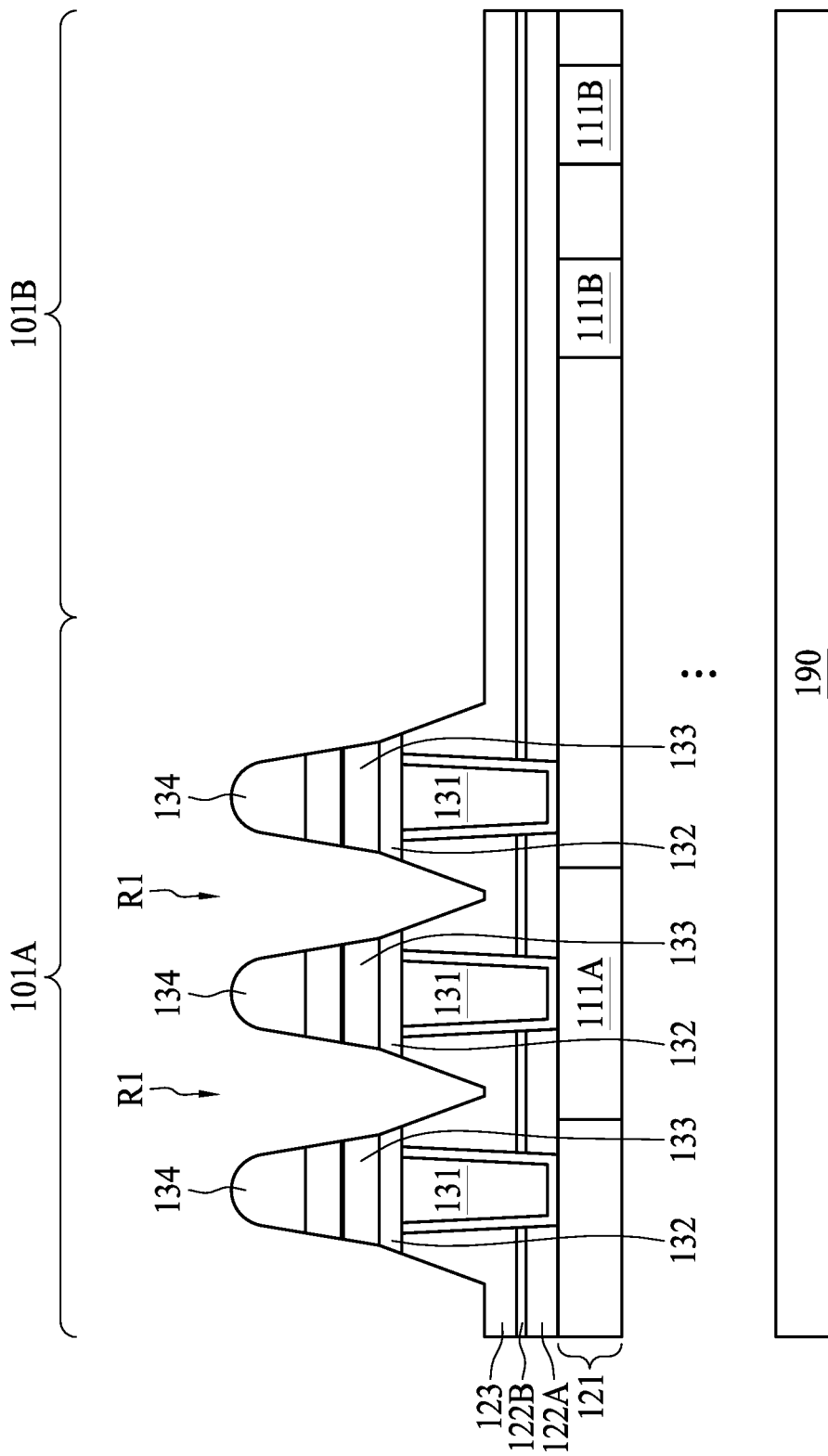

Referring to FIG. 6, FIG. 6 is a cross sectional view of a semiconductor device during intermediate stages of manufacturing operations, according to some embodiments of present disclosure. A photomask 199 is formed over the memory region 101A and above the hard mask material layer 134M. Referring to FIG. 7, FIG. 7 is a cross sectional view of a semiconductor device during intermediate stages of manufacturing operations, according to some embodiments of present disclosure. The photomask 199 is utilized to pattern hard mask material layer 134M, either by lithography and/or etching operation, to form a hard mask 134. The hard mask 134 is then utilized to pattern the MTJ material layer 133M and the bottom electrode material layer 132M to respectively form an MTJ 133 and bottom electrode 132. A first recess R1 is formed at a top surface of the first dielectric layer 123 and is between two adjacent BEVAs 131. The bottom electrode material layer 132M, the MTJ material layer 133M, the hard mask material layer 134M, and an upper portion of the first dielectric layer 123 in the logic region 101B are removed. A bottom portion of the first dielectric layer 123 may remain in the logic region 101B.

Figure 8:
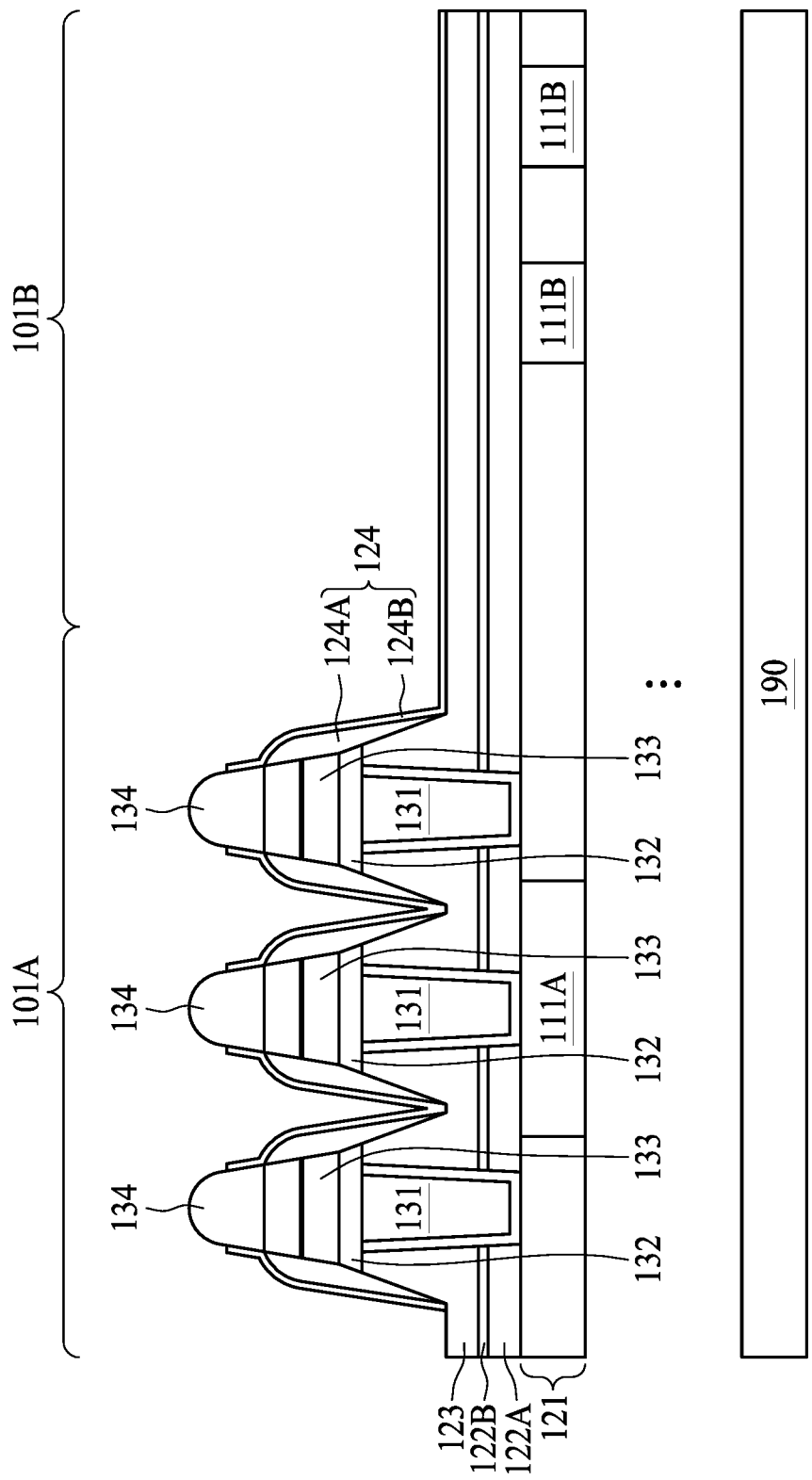

Referring to FIG. 8, FIG. 8 is a cross sectional view of a semiconductor device during intermediate stages of manufacturing operations, according to some embodiments of present disclosure. Spacers 124 are formed on the sidewall of the first recess R1 and a sidewall of the MTJ 133. In some embodiments, the spacers 124 may further cover a sidewall of the bottom electrode 132, and/or a portion of the hard mask 134. The spacer 124 may further extend above the remaining first dielectric layer 123 in the logic region 101B. A portion of the hard mask 134 may be exposed from the spacers 124. In some of the embodiments, the spacer 124 includes multi-layer structure, for example, a first spacer 124A and a second spacer 124B over the first spacer 124A, wherein both of the first spacer 124A and the second spacer 124B are made with passivation material. In some embodiments, the second spacer 124B is in direct contact with the hard mask 134 and a top surface of the first dielectric layer 123.

Figure 9:
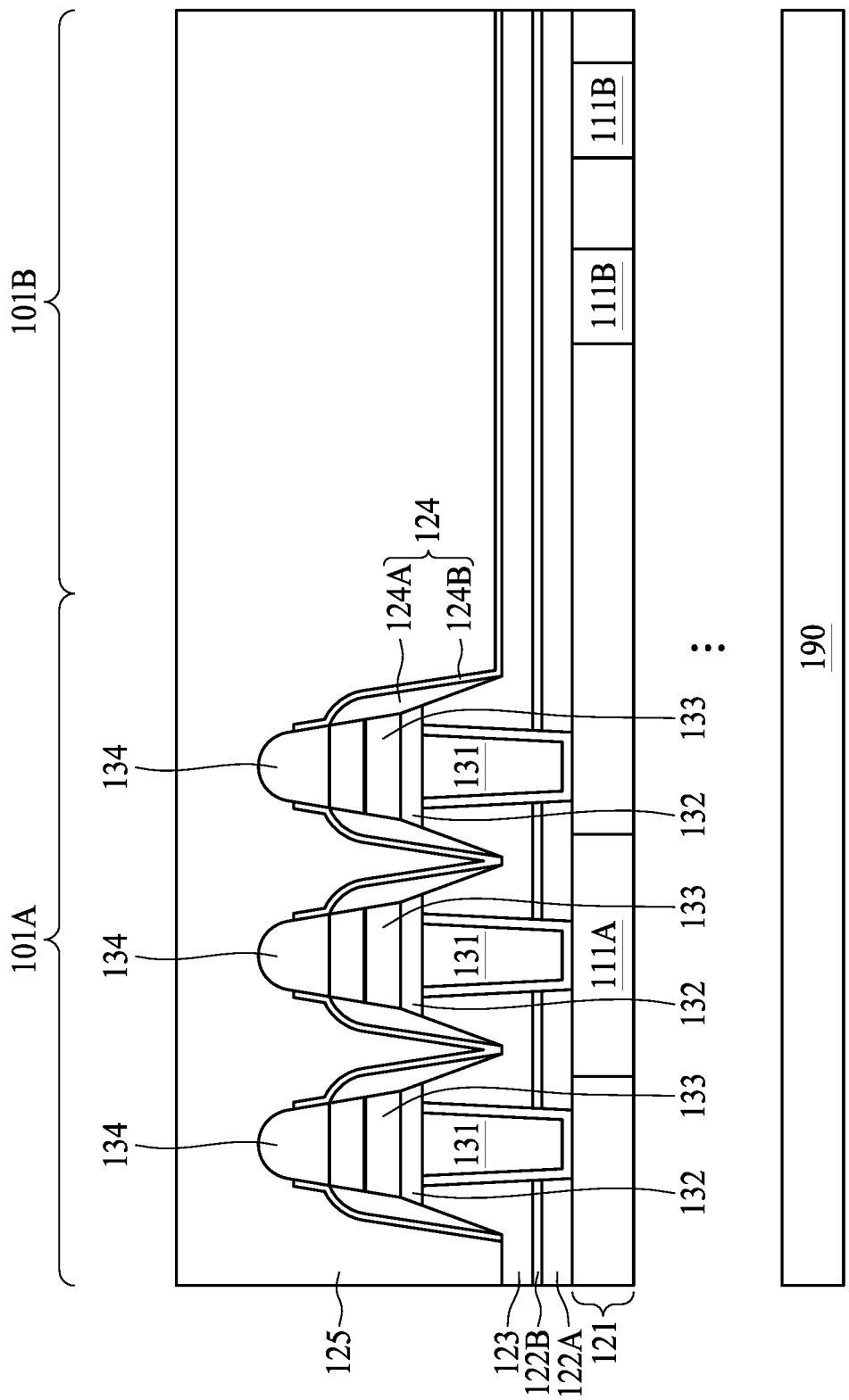
Figure 10:
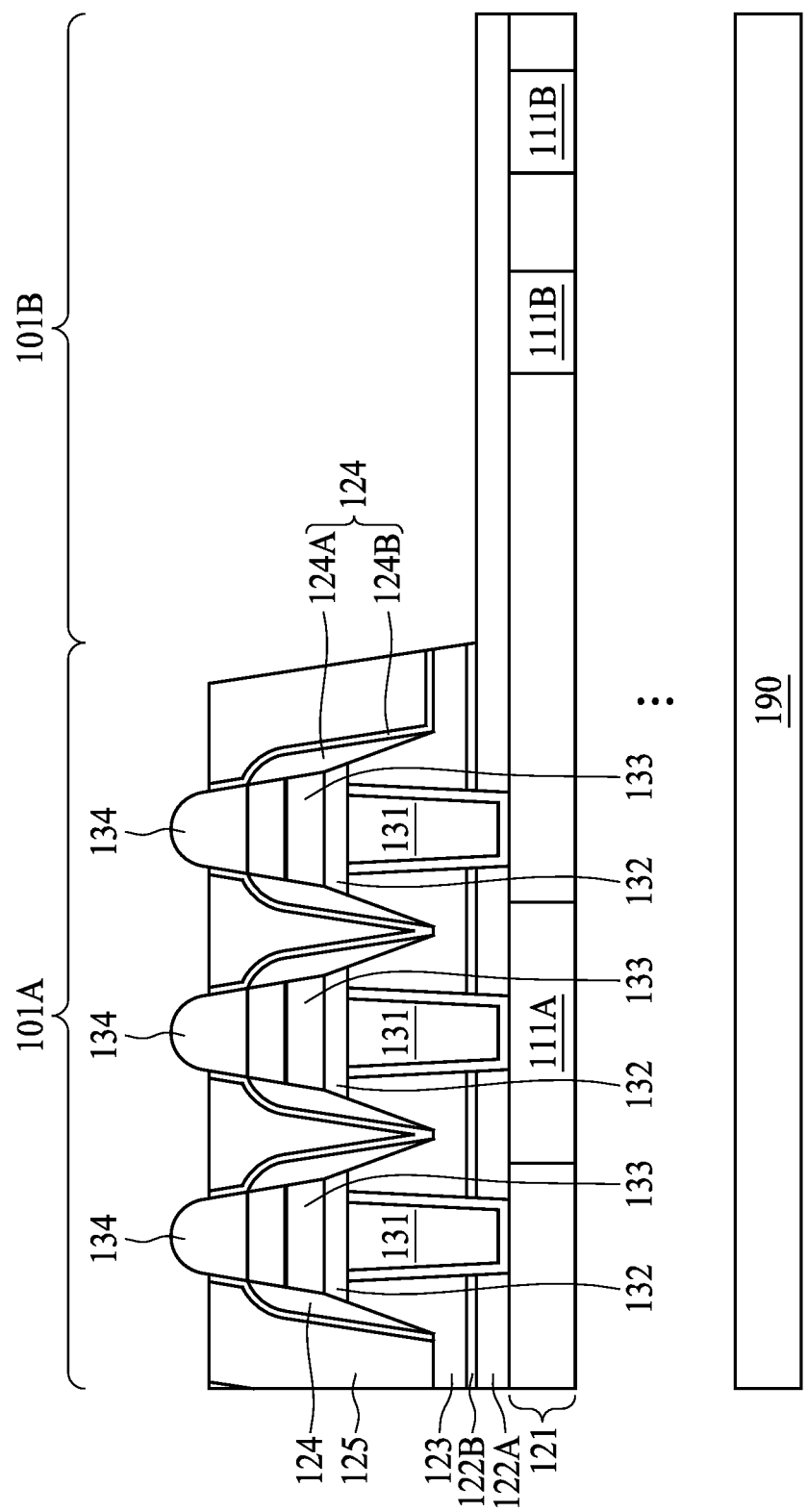

Referring to FIG. 9, FIG. 9 is a cross sectional view of a semiconductor device during intermediate stages of manufacturing operations, according to some embodiments of present disclosure. A second dielectric layer 125 is formed over the memory region 101A and the logic region 101B to cover the spacer 124 and the hard mask 134. Referring to FIG. 10, FIG. 10 is a cross sectional view of a semiconductor device during intermediate stages of manufacturing operations, according to some embodiments of the present disclosure. The second dielectric layer 125 in the logic region 101B is removed by patterning and/or etching operation. In some of the embodiments, an upper portion of the second dielectric layer 125 above the memory region 101A may also be removed, and a top portion of the hard mask 134 may be exposed from the second dielectric layer 125. In some embodiments, at least a portion of the second etch stop film 122B of the etch stop layer 122 in the logic region 101B may be removed during the removal operation, thereby the first etch stop film 122A is exposed.

Figure 11:
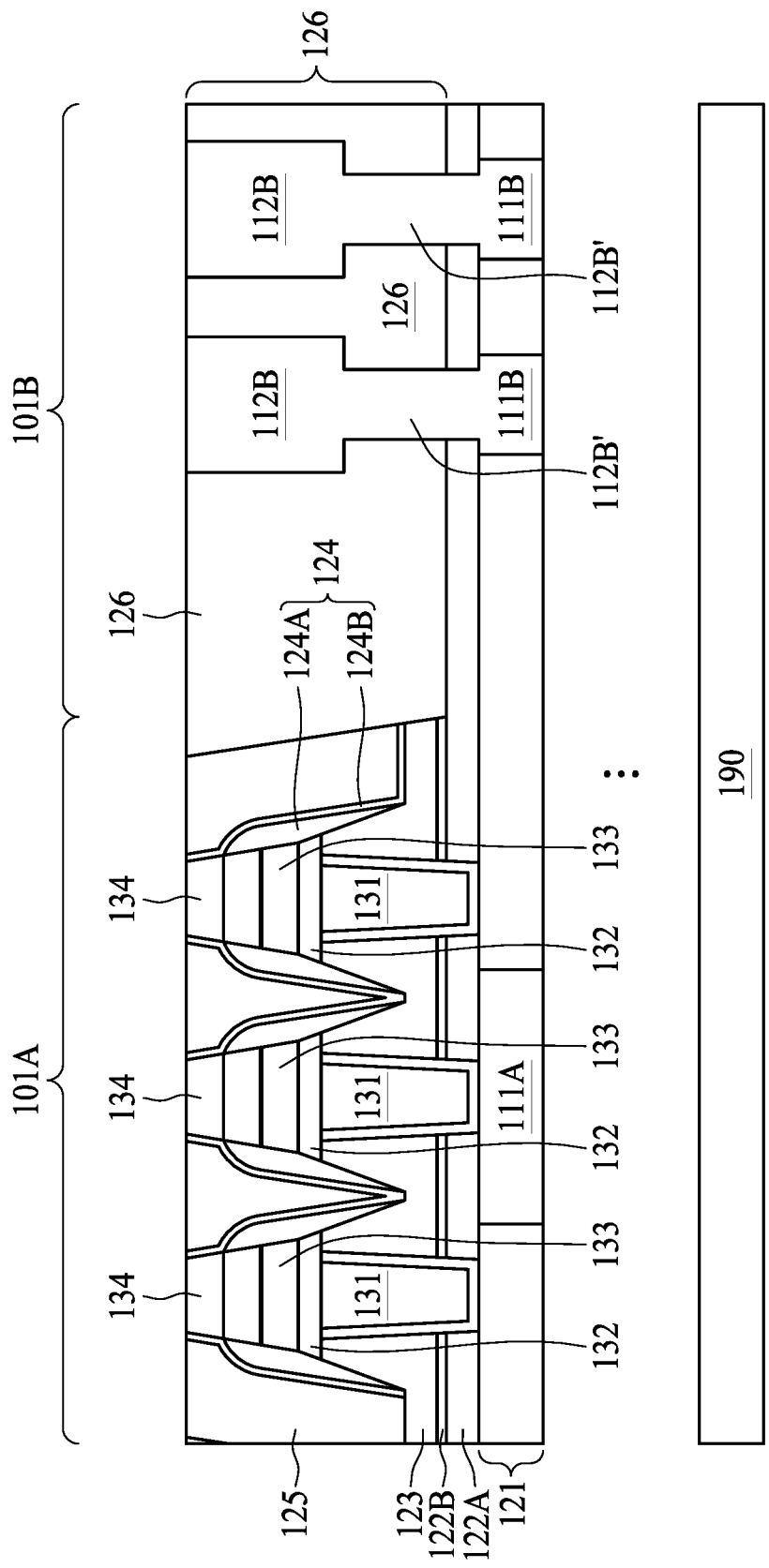

Referring to FIG. 11, FIG. 11 is a cross sectional view of a semiconductor device during intermediate stages of manufacturing operations, according to some embodiments of present disclosure. The $N^{th}$ metallization layer 126 is formed over the memory region 101A and the logic region 101B, an $(N-1)^{th}$ via 112B' and an $N^{th}$ metal line 112B over the $(N-1)^{th}$ via 112B' is formed in the $N^{th}$ metallization layer 126 over the logic region 101B in order to connect with the second $(N-1)^{th}$ metal line 111B. A planarization operation (such as chemical mechanical planarization operation) is performed over the memory region 101A and the logic region 101B to remove the excessive portion of the $N^{th}$ metallization layer 126 and the excessive portion of the conductive material of the $N^{th}$ via 112B. In some embodiments, a top portion of the hard mask 134 is also removed, thereby having a top surface coplanar with the top surface of the second dielectric layer 125 and the top surface of the $N^{th}$ metallization layer 126 after the planarization operation.

Hereinafter, the subsequent fabrication operations after the intermediate step in FIG. 11 for forming the semiconductor device 100A (corresponding to embodiments in FIG. 2A to FIG. 2B) is subsequently discussed in FIG. 12A through FIG. 12D, and the subsequent fabrication operations after the intermediate step in FIG. 11 for forming the semiconductor device 100B (corresponding to alternative embodiments in FIG. 3A to FIG. 3B) is subsequently discussed in FIG. 13A through FIG. 13D.

Figure 12A:
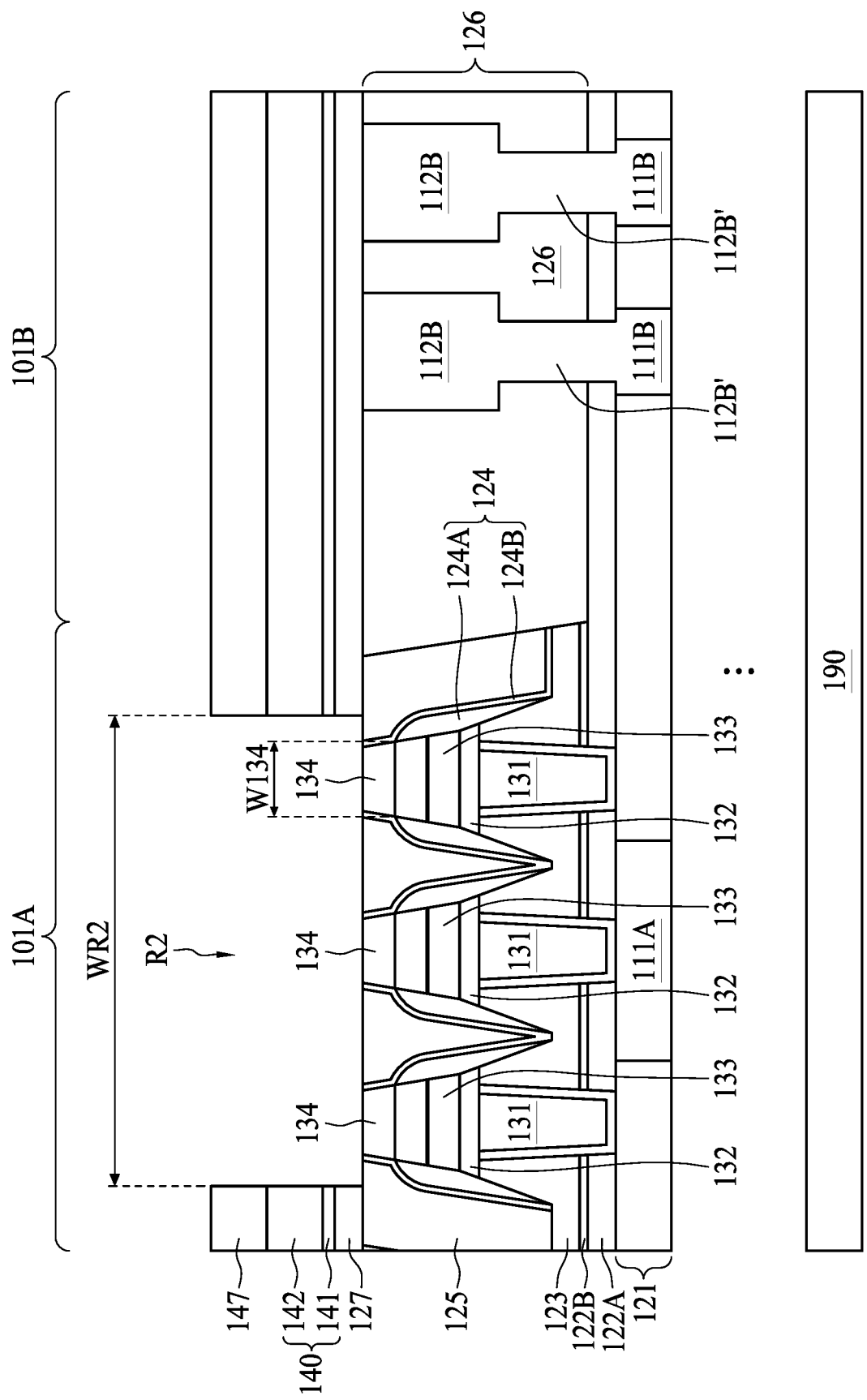
FIG. 12A to FIG. 12D are cross sectional views of a semiconductor device during intermediate stages of manufacturing operations, according to some embodiments of the present disclosure.

Referring to FIG. 12A, FIG. 12A is a cross sectional view of a semiconductor device during intermediate stages of manufacturing operations, according to some embodiments of present disclosure. A protection layer 127 is formed in the memory region 101A and the logic region 101B, and over the second dielectric layer 125. In some embodiments, the protection layer 127 includes silicon carbide, silicon oxide, silicon nitride, silicon oxynitride, or the like. An etch stop stack 140 is formed over the memory region 101A and the logic region 101B, and is above the protection layer 127. In some embodiments, the etch stop stack 140 includes multi-layer structure, for example, a first layer 141 and a second layer 142 over the first layer 141. In some embodiments, the first layer 141 includes aluminum-derivative layer (such as aluminum oxide), and the second layer 142 may include tetraethyl orthosilicate (TEOS). A pattern layer 147 is formed over the etch stop stack 140. In some embodiments, the pattern layer 147 may include titanium nitride (TiN), or other materials that can be patterned via lithography operation and/or etching operation.

By using the pattern layer 147 in an etching operation, a second recess R2 is formed in the etch stop stack 140 over the memory region 101A to expose the hard mask 134 and the second dielectric layer 125. A width WR2 of the second recess is greater than a width W134 of the hard mask 134. The etchant may include HBr, $CF_4$, He, $O_2$, $N_2$, $CH_xF_y$, the combination thereof, or the like. The etch stop stack 140 facilitate the controlling of forming the second recess R2 since the etch rate of etchant on second dielectric layer 125 may be greater. In some comparative embodiment of being lack of such etch stop means, the underlying memory structure (including the MTJ 133, the spacer 124, the bottom electrode 132, et cetera) may be damaged during the formation of second recess R2. Such circumstance may cause defect, leakage issues and/or failure of the semiconductor device.

Furthermore, since the top surface of the second dielectric layer 125 and the top surface of the $N^{th}$ metallization layer 126 are planarized, the etch stop stack 140 and the protection layer 127 are horizontally formed over a substantial plane. In comparative embodiment of having a etch stop layer conforming with the underlying memory structure (i.e. non-uniformed profile), the control of etching rate, etching duration and the profile of the second recess R2 may be more difficult.

Figure 12B:
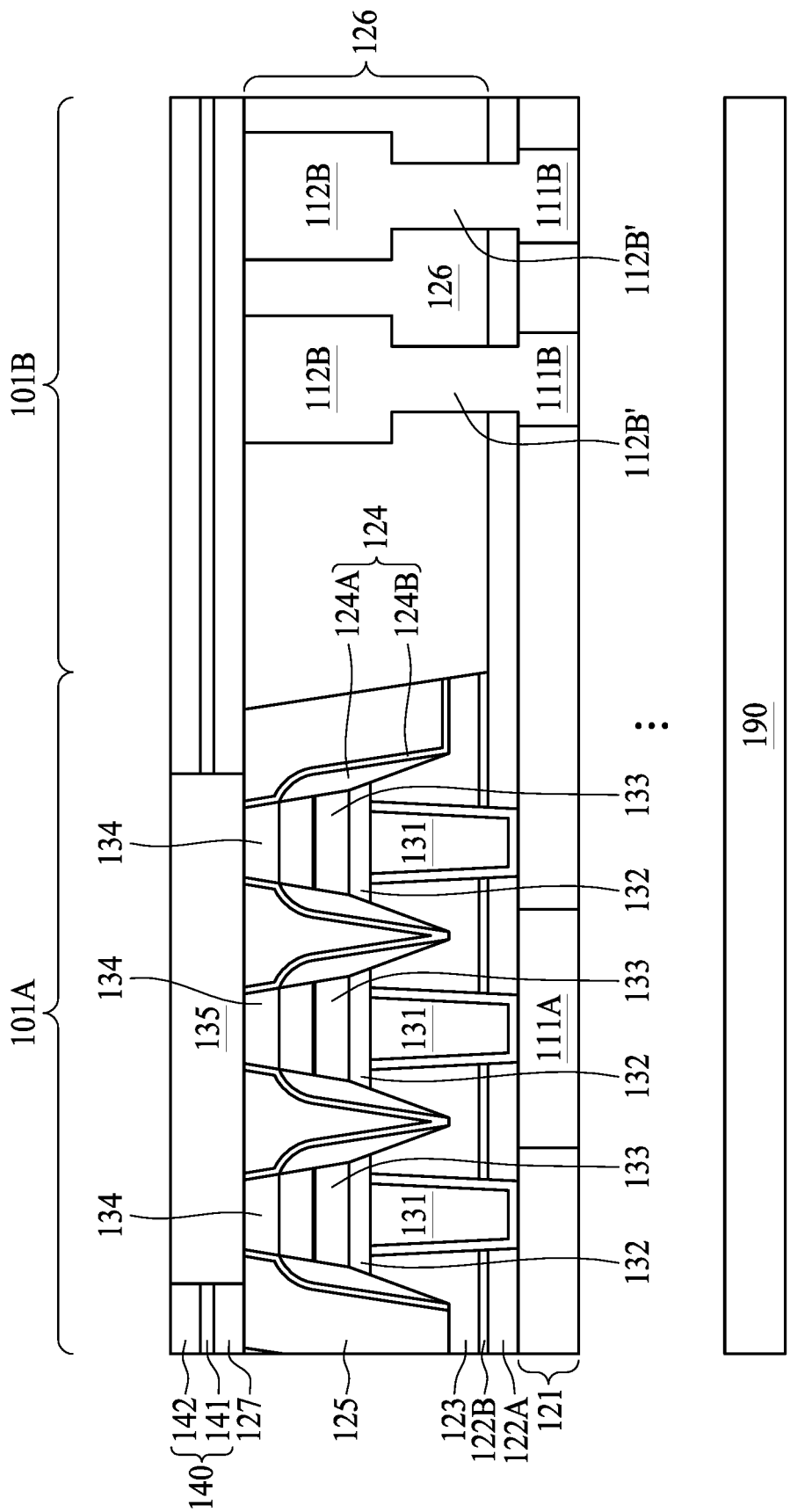

Referring to FIG. 12B, FIG. 12B is a cross sectional view of a semiconductor device during intermediate stages of manufacturing operations, according to some embodiments of present disclosure. A conductive material, such as copper (or the like), is formed in the second recess R2. A planarization operation, such as chemical mechanical operation (CMP), may be performed to remove the pattern layer 147 and excessive conductive material to form the top electrode 135. In some embodiments, the second layer 142 of the etch stop stack 140 is utilized as a planarization stop layer in the planarization operation, thus the planarization is stopped at the second layer 142 while the first layer 141 is free from being exposed from the second layer 142.

Figure 12C:
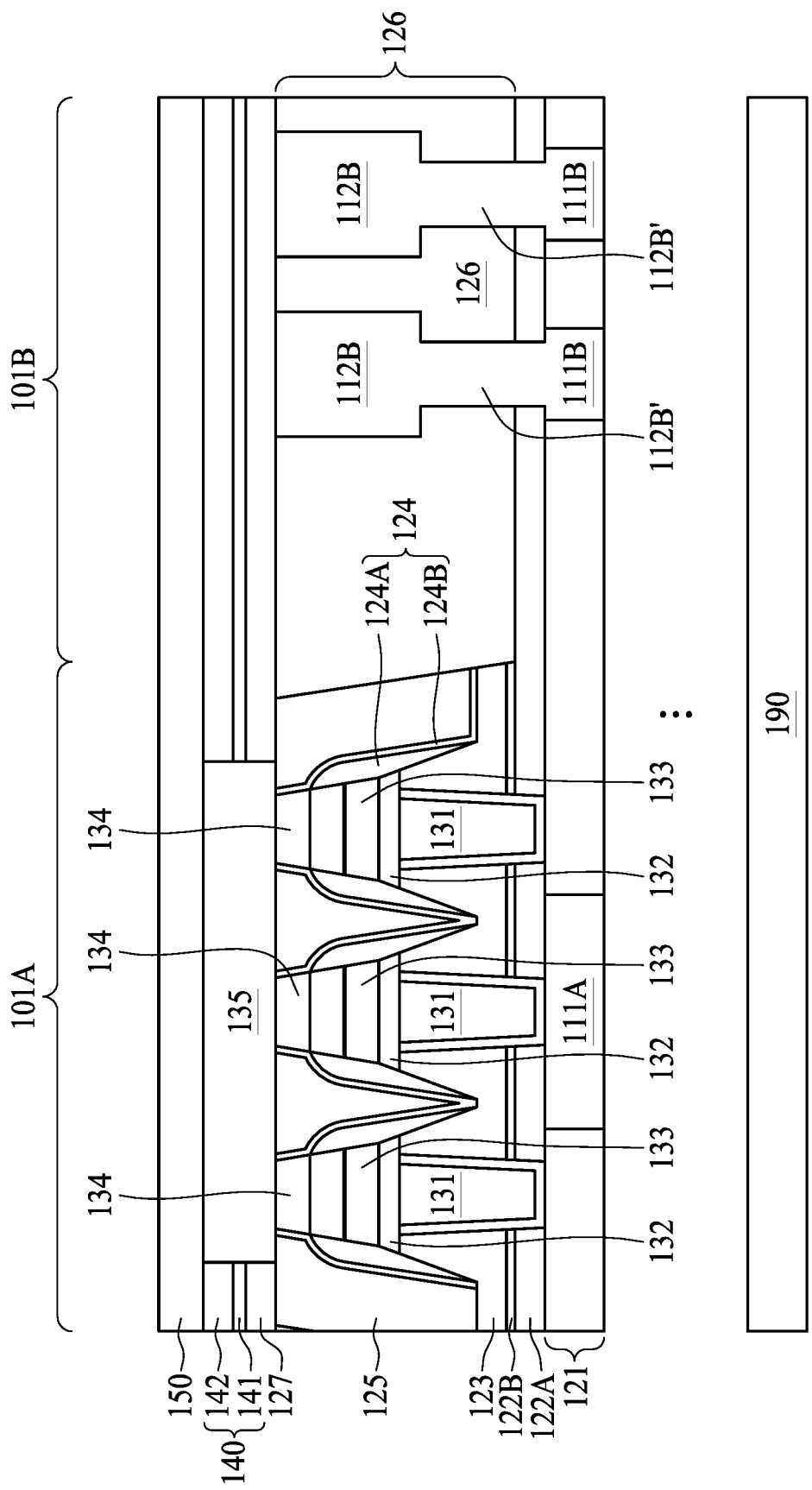

Referring to FIG. 12C, FIG. 12C is a cross sectional view of a semiconductor device during intermediate stages of manufacturing operations, according to some embodiments of present disclosure. A barrier layer 150 is disposed over the etch stop stack 140 and the top electrode 135. In some embodiments, a material of the barrier layer 150 can be, for example, may be selected from silicon carbide, silicon oxide, silicon nitride, silicon oxynitride, or the like. In some embodiments, a material of the barrier layer 150 can be identical with the protection layer 127.

Figure 12D:
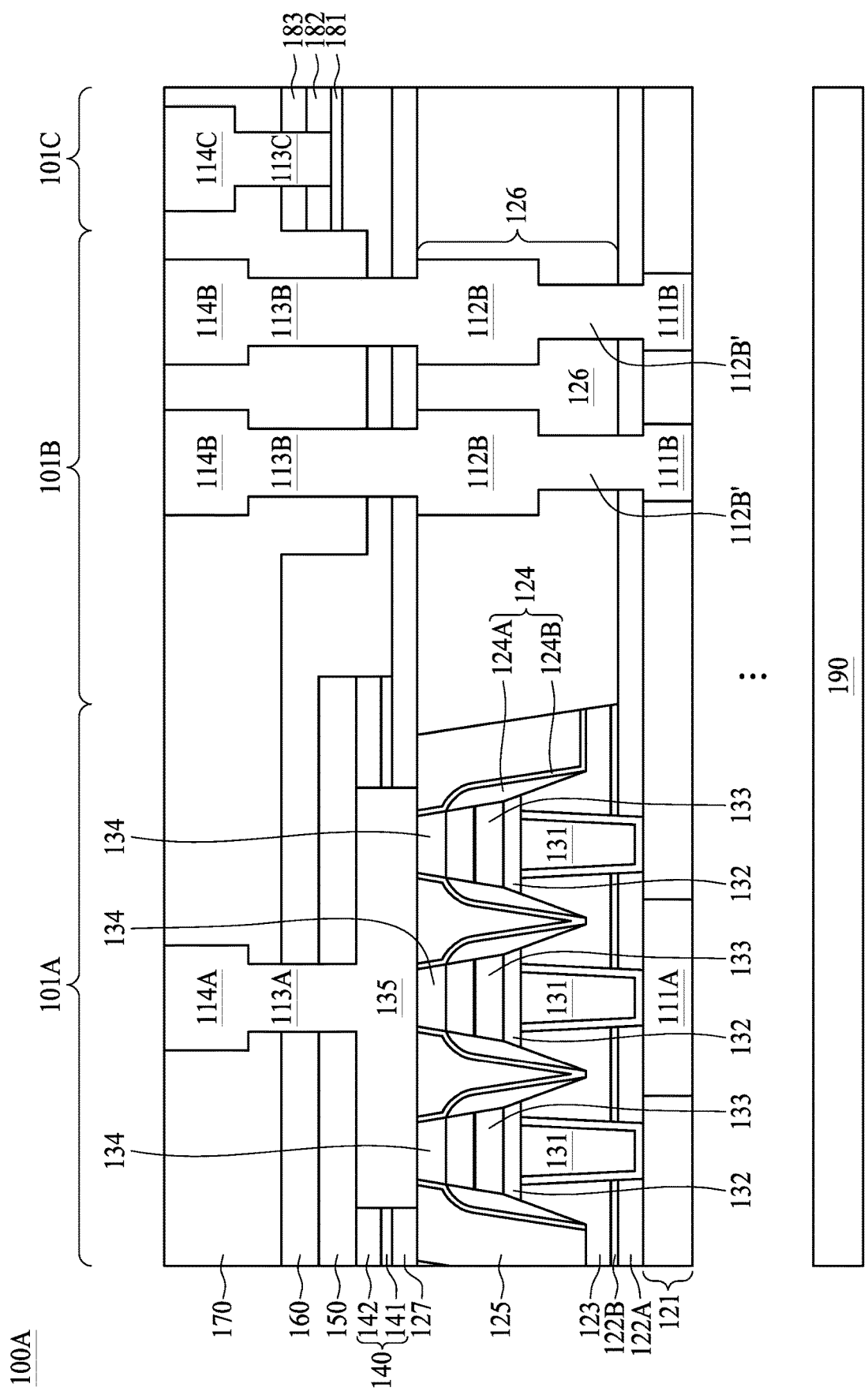

Referring to FIG. 12D, FIG. 12D is a cross sectional view of a semiconductor device during intermediate stages of manufacturing operations, according to some embodiments of present disclosure. The etch stop stack 140 and the barrier layer 150 in the logic region 101B are removed by etching operation, wherein the etching operation may include a combination of dry etching and wet etching. The etching operation is performed until a level lower than the etch stop stack 140 is reached. The first layer 141 of the etch stop stack 140, which include aluminum-derivative material, may serve as an etch stop layer to control the rate and duration of such etching operation. By virtue of the presence of the first layer 141 for controlling the etching operation, the issue of etching through the protection layer 127 in the logic region 101B may be alleviated. It should be noted that the etch rate on the first layer 141 is lower than the etch rate on the second layer 142 or the protection layer 127 in the aforementioned etching operation.

Subsequently, a capping layer 160 is formed above the barrier layer 150 in the memory region 101A and above the protection layer 127 in the logic region 101B. In some embodiments, the capping layer 160 may include oxide, such as tetraethyl orthosilicate (TEOS). A top surface of the capping layer 160 in the memory region 101A may be above a top surface of the capping layer 160 in the logic region 101B. An IMD layer 170 is above the capping layer 160. In some embodiments, a portion of the capping layer 160 in a passive device region 101C (different from the memory region 101A and the logic region 101B) has a top surface above the op surface of the capping layer 160 in the logic region 101B, which can be achieved by patterning, selective deposition, selective removal, the combination thereof, or the like.

A first $N^{th}$ via 113A and a first $(N+1)^{th}$ line 114A above the first $N^{th}$ via 113A are formed over the top electrode 135 in memory region 101A. Specifically, a portion of the barrier layer 150, a portion of the capping layer 160, and a portion of the IMD layer 170 in order to form the interconnection structures therein. Herein the barrier layer 150 and the capping layer 160 may serve as an etch stop layer to control the removal operation.

A second $N^{th}$ via 113B and a second $(N+1)^{th}$ line 114B above the second $N^{th}$ via 113B are formed over the $N^{th}$ via 112B in the logic region 101B. The second $N^{th}$ via 113B penetrates the capping layer 160 and the remaining protection layer 127 in the logic region 101B. A planarization operation, such as CMP, can be performed over the IMD layer 170 so that a top surface of the first $(N+1)^{th}$ line 114A is coplanar with a top surface of the second $(N+1)^{th}$ line 114B.

Optionally, the passive device region 101C (which can be referred to as Hi-R region) may be formed. In some embodiments, a thin tantalum nitride film 181 is formed over the protection layer 127 and the capping layer 160, a barrier layer 182 (similar to the aforementioned barrier layer 150) is formed over the thin tantalum nitride film 181, and an oxide layer 183 (such as TEOS layer) is formed over the barrier layer 182. A third $N^{th}$ via 113C is formed to penetrate the barrier layer 182 and oxide layer 183, and a third $(N+1)^{th}$ metal line 114C may be formed over the third $N^{th}$ via 113C.

Figure 13A:
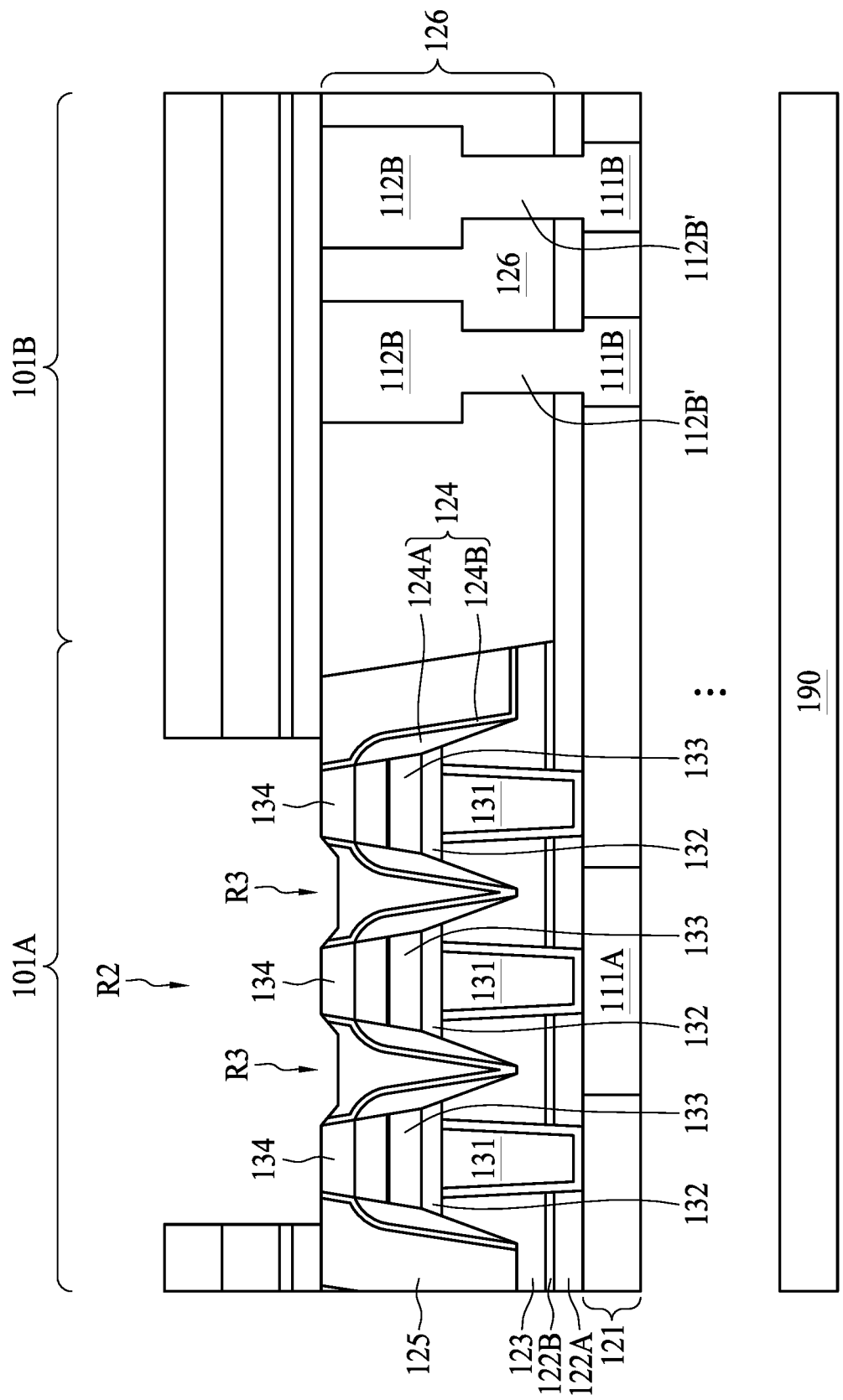
FIG. 13A to FIG. 13D are cross sectional views of a semiconductor device during intermediate stages of manufacturing operations, according to some embodiments of the present disclosure.

Referring to FIG. 13A, FIG. 13A is a cross sectional view of a semiconductor device during intermediate stages of manufacturing operations, according to some embodiments of present disclosure. The operations of FIG. 13A is similar to the operations discussed in FIG. 12A. The difference resides in that during the operation of forming the second recess R2 in the etch stop stack 140 over the memory region 101A, a third recess R3 is formed in the second dielectric layer 125 and between each two of the hard mask 134. Alternatively stated, a bottom of the third recess R3 is lower than the top surface of the hard mask 134.

Figure 13B:
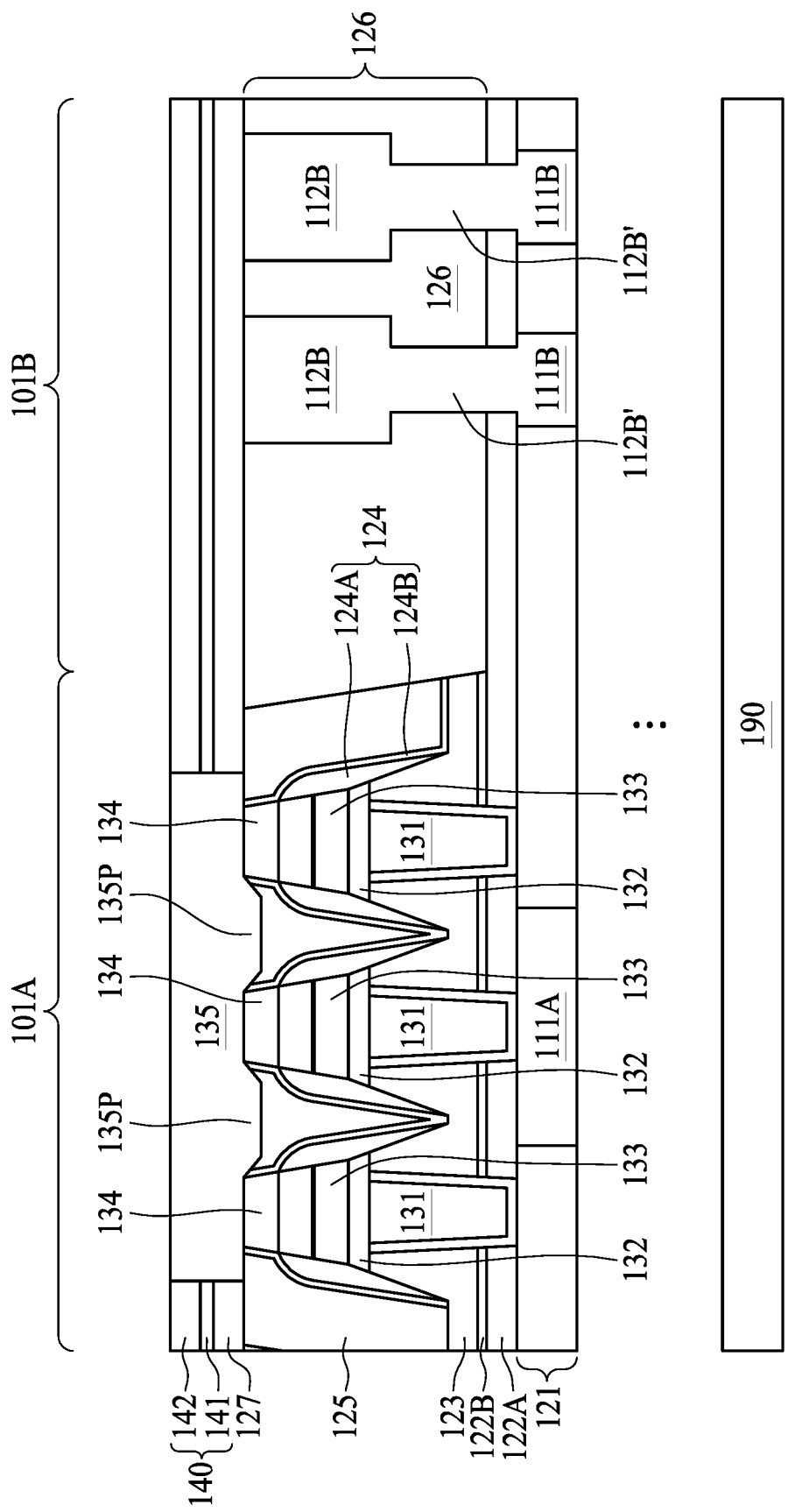

Referring to FIG. 13B, FIG. 13B is a cross sectional view of a semiconductor device during intermediate stages of manufacturing operations, according to some embodiments of present disclosure. Similar to the operation as discussed in FIG. 12B, a conductive material is formed in the second recess R2 and the third recess R3. A planarization operation, such as chemical mechanical operation (CMP), may be performed to remove the pattern layer 147 and excessive conductive material to form the top electrode 135. Herein the portion of the top electrode 135 in the third recess R3 are referred to as a protruding portion 135P, which protrudes toward the $(N-1)^{th}$ metallization layer 121.

By virtue of using the etch stop stack 140 to control the formation of the second recess R2 and the third recess R3, the damage to the spacer 124 and the second dielectric layer 125 may be alleviated. Specifically, the spacer 124 may be free from being in direct contact with the protruding portion 135P, or, the spacer 124 may be free from being penetrated by the protruding portion 135P. Thereby, leakage or short issue may be alleviated.

In a comparative embodiment of having an etch stop layer conforming the shape of underlying memory structures, for example, at least a portion of a sidewall of the hard mask 134, the control of timing/duration of the etching may be difficult, the second dielectric layer 125 may be over-etched, rendering a more difficult profile for subsequent metal filling.

Figure 13C:
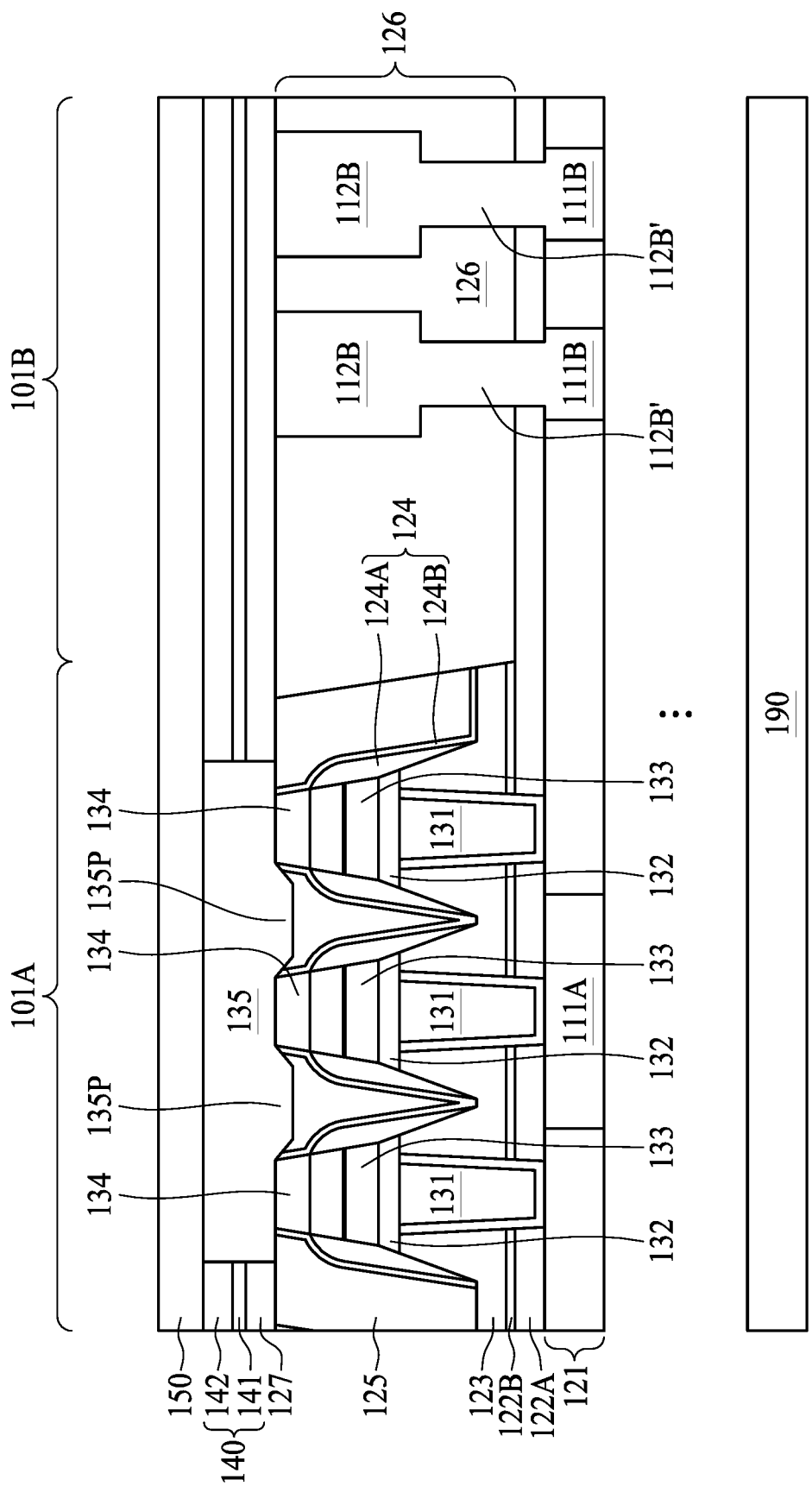

Referring to FIG. 13C, FIG. 13C is a cross sectional view of a semiconductor device during intermediate stages of manufacturing operations, according to some embodiments of present disclosure. Similar to the operation in FIG. 12C, a barrier layer 150 is disposed over the etch stop stack 140 and the top electrode 135.

Figure 13D:
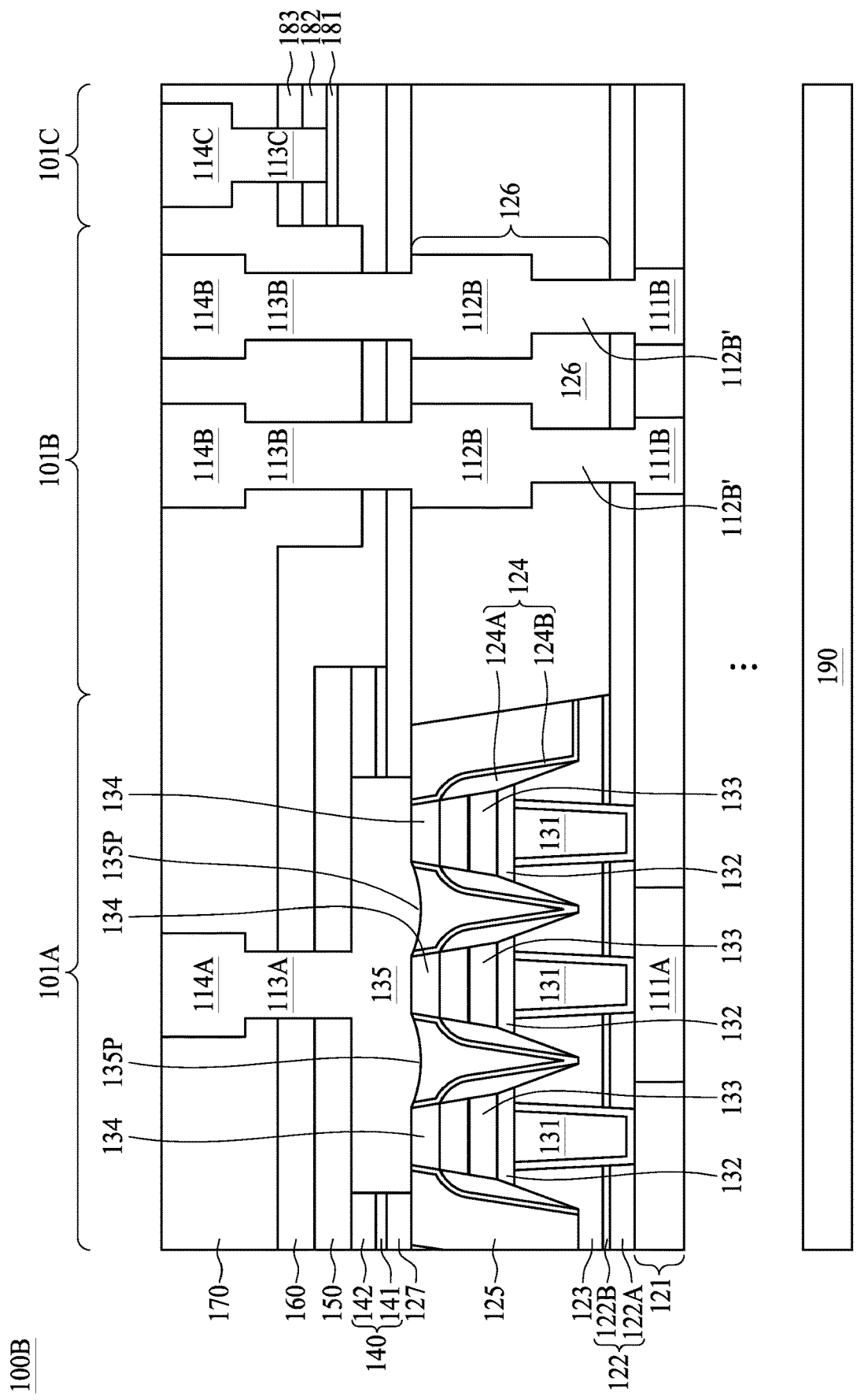

Referring to FIG. 13D, FIG. 13D is a cross sectional view of a semiconductor device during intermediate stages of manufacturing operations, according to some embodiments of the present disclosure. The operations in FIG. 13D is substantially similar to the operations discussed in FIG. 12D, where the etch stop stack 140 and the barrier layer 150 in the logic region 101B are removed by etching operation, wherein the etching operation may include a combination of dry etching and wet etching. Subsequently, a capping layer 160 is formed above the barrier layer 150 in the memory region 101A and above the protection layer 127 in the logic region 101B. A first $N^{th}$ via 113A and a first $(N+1)^{th}$ line 114A above the first $N^{th}$ via 113A are formed over the top electrode 135 in memory region 101A, and a second $N^{th}$ via 113B and a second $(N+1)^{th}$ line 114B above the second $N^{th}$ via 113B are formed over the $N^{th}$ via 112B in the logic region 101B. A planarization operation, such as CMP, can be performed over the IMD layer 170 so that a top surface of the first $(N+1)^{th}$ line 114A is coplanar with a top surface of the second $(N+1)^{th}$ line 114B. Optionally, a passive device region 101C (similar to the one discussed in FIG. 12D) can be formed.

The present disclosure provides semiconductor devices 100A and 100B, and a method for fabrication thereof with a "top electrode-last" approach to alleviate the issue(s) related to via punch through. As the memory cell dimension continues to shrink, the top electrode corresponding to each MTJ cell becomes smaller than the landing via. Especially when MTJ cell is often selected to put in M5 or M6 metal layers considering thermal budget of the MTJ cell, conventional one via-to-one top electrode is not sustainable when the dimension of the memory cell continues to shrink and form high density connection pitch at M5 or M6 metal layers. The dimension mismatch between the landing via and the top electrode can contribute to landing via punch through, where the landing via can be in contact with the magnetic layers of the MTJ due to the over-etched landing via trench. For example, the recess for forming the via may penetrate a spacer that protects the MTJ. Therefore, by having a wider top electrode 135 filled in a wider top electrode trench, and connects with multiple memory cells 101, the difficulty of dimension mismatch can be decreased, as one first $N^{th}$ via 113A may be electrically connected to multiple memory cells 101 and thereby controlling the state of the MTJs 133. Such configuration also allows the top electrode 135 to have a relatively thicker thickness since it is disposed in a metallization layer above the other metallization layer where the memory cells 101 resides.

Furthermore, the configuration of the protection layer 127, the etch stop stack 140, the barrier layer 150, and the capping layer 160 can help controlling the related removal operations so that the aforesaid technique may be compatible to mature interconnection fabrication while alleviating via punch-through issue. In addition, the etch stop stack 140 help alleviating the over-etching issue over a top surface of the second dielectric layer 125, so that the via punch through due to the over-etch casing damage to spacer 124 or the MTJ 133 may be alleviated.

In addition, by aligning the top surface of the second dielectric layer 125 in the memory region 101A with the $N^{th}$ metallization layer 126 in the logic region 101B with a planarization operation, the etch stop stack 140 (the first layer 141 and the second layer 142) may be extending horizontally, thereby the controlling of etching duration/etch rate can be improved comparing to etch stop means that has a non-uniform profile.

Some embodiments of the present disclosure provide a substrate, including a first region and a second region adjacent to the first region, a magnetic tunnel junction (MTJ) over the first region, a spacer on a sidewall of the MTJ, a hard mask over the MTJ, a first dielectric layer laterally surrounding the spacer and the hard mask, a top electrode over the hard mask, and an etch stop stack laterally surrounding the top electrode.

Some embodiments of the present disclosure provide a semiconductor structure, including a substrate, a first magnetic tunnel junction (MTJ) over the substrate, a second MTJ adjacent to the first MTJ, a top electrode laterally extending over the first MTJ and the second MTJ, wherein a bottom surface of the top electrode is substantially flat.

Some embodiments of the present disclosure provide a method for fabricating a semiconductor structure, including providing a substrate, forming a first magnetic tunnel junction (MTJ) over a first region of the substrate, forming a first conductive via over a second region of the substrate adjacent to the first region, forming an etch stop stack over the first region and the second region, forming a recess in the etch stop stack by an etching operation, and forming a top electrode in the recess.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a substrate, comprising a first region and a second region adjacent to the first region;
   a magnetic tunnel junction (MTJ) over the first region;
   a spacer on a sidewall of the MTJ;
   a hard mask over the MTJ;
   a first dielectric layer laterally surrounding the spacer and the hard mask;
   a top electrode over the hard mask; and
   an etch stop stack laterally surrounding the top electrode.

2. The semiconductor structure of claim 1, wherein a top surface of the first dielectric layer is coplanar with a top surface of the hard mask.

3. The semiconductor structure of claim 1, wherein the etch stop stack comprises an aluminum-derivative layer, wherein the aluminum-derivative layer is in direct contact with the top electrode.

4. The semiconductor structure of claim 3, wherein the second region is free from coverage of the aluminum-derivative layer.

5. The semiconductor structure of claim 1, wherein a bottom surface of the top electrode is below a bottom surface of the etch stop stack.

6. The semiconductor structure of claim 1, wherein a sidewall of the hard mask is free from contacting the top electrode.

7. The semiconductor structure of claim 1, wherein the MTJ is leveled with an $N^{th}$ metal layer of the second region, and the top electrode is leveled with an $(N+1)^{th}$ via of the second region.

8. The semiconductor structure of claim 1, further comprising:
   a barrier layer over the top electrode; and
   a conductive via penetrating the barrier layer.

9. The semiconductor structure of claim 1, further comprising an oxide layer over the first region and the second region, wherein a top surface of the oxide layer in the first region is at a level higher than a top surface of the oxide layer in the second region.

10. A semiconductor structure, comprising:
    a substrate;
    a first magnetic tunnel junction (MTJ) over the substrate;
    a second MTJ adjacent to the first MTJ;
    a top electrode laterally extending over the first MTJ and the second MTJ, wherein a bottom surface of the top electrode is substantially flat;

a dielectric layer laterally surrounding the first MTJ, wherein a portion of the dielectric layer is in direct contact with the bottom surface of the top electrode; and an etch stop layer laterally surrounding the top electrode.

11. The semiconductor structure of claim 10, further comprising a first hard mask spacing between the first MTJ and the bottom surface of the top electrode.

12. The semiconductor structure of claim 10, wherein the dielectric layer laterally surrounds the first hard mask.

13. The semiconductor structure of claim 11, wherein a top surface of the dielectric layer is substantially coplanar with a top surface of a top surface of the first hard mask.

14. The semiconductor structure of claim 10, further comprising a spacer lining at a sidewall of the first MTJ, wherein the spacer comprises a first portion in direct contact with the top electrode and a second portion at a first level below a second level of a bottom surface of the first MTJ.

15. A method for fabricating a semiconductor structure, comprising:

providing a substrate;

forming a first magnetic tunnel junction (MTJ) over a first region of the substrate;

forming a first conductive via over a second region of the substrate adjacent to the first region;

forming an etch stop stack over the first region and the second region;

forming a recess in the etch stop stack by an etching operation; and forming a top electrode in the recess.

16. The method of claim 15, further comprising:

performing a planarization operation over the first MTJ and the first conductive via prior to forming the etch stop stack.

17. The method of claim 16, further comprising removing the etch stop stack in the second region subsequent to forming the top electrode.

18. The method of claim 15, further comprising forming a barrier layer over the etch stop stack and the top electrode in the first region and over the first conductive via in the second region.

19. The method of claim 18, further comprising removing the barrier layer from the second region until a level lower than the etch stop stack in the first region is reached.

20. The method of claim 18, further comprising forming second conductive vias in the first region and the second region subsequent to forming the barrier layer.

* * * * *